(12) United States Patent
Yamamichi

(10) Patent No.: US 6,292,352 B1
(45) Date of Patent: Sep. 18, 2001

(54) THIN FILM CAPACITOR

(75) Inventor: Shintaro Yamamichi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/583,871

(22) Filed: May 31, 2000

(30) Foreign Application Priority Data

Jun. 7, 1999 (JP) .................................. 11-159416

(51) Int. Cl.$^7$ .............................. H01G 4/06; H01L 27/108
(52) U.S. Cl. ...................... 361/311; 361/306.1; 361/313; 361/306.3; 257/295; 257/306
(58) Field of Search .................. 361/301.4, 306.1, 361/306.3, 311–313; 257/295, 296, 303, 306, 310, 528

(56) References Cited

U.S. PATENT DOCUMENTS

| | | | |
|---|---|---|---|
| 5,572,052 | * 11/1996 | Kashihara et al. | 257/295 |
| 5,739,563 | * 4/1998 | Kawakubo et al. | 257/295 |
| 6,046,469 | * 4/2000 | Yamazaki et al. | 257/306 |
| 6,144,053 | * 11/2000 | Tsunemine | 257/295 |
| 6,201,271 | * 3/2001 | Okutoh et al. | 257/295 |

FOREIGN PATENT DOCUMENTS

| | | |
|---|---|---|
| 7-99198 | 4/1995 | (JP) . |
| 9-82914 | 3/1997 | (JP) . |
| 2639355 | 4/1997 | (JP) . |
| 9-283623 | 10/1997 | (JP) . |
| 10-65001 | 3/1998 | (JP) . |
| 10-209394 | 8/1998 | (JP) . |
| 10-223848 | 8/1998 | (JP) . |

OTHER PUBLICATIONS

S. Yamamichi et al., "An ECR MOCVD (Ba,Sr)TiO$_3$ based stacked capacitor technology with RuO$_2$/Ru/TiN/TiSi$_x$ storage nodes for Gbit–scale DRAMs", *IEDM 95*, 1995, pp. 119–122.

* cited by examiner

Primary Examiner—Anthony Dinkins
(74) Attorney, Agent, or Firm—Sughrue, Mion, Zinn, Macpeak & Seas, PLLC

(57) ABSTRACT

There is provided a thin film capacitor including (a) a semiconductor substrate, (b) an interlayer insulating film formed on the semiconductor substrate, (c) a contact formed throughout the interlayer insulating film such that the contact has an upper surface upwardly projecting, (d) a lower electrode formed on the interlayer insulating film such that the lower electrode covers the upper surface of the contact therewith, (e) a capacitor insulating film covering the lower electrode and the interlayer insulating film therewith, and (f) an upper electrode formed on the capacitor insulating film. The thin film capacitor prevents peeling between the contact and the lower electrode even in an annealing step.

20 Claims, 26 Drawing Sheets

THIN FILM CAPACITOR

BACKGROUND OF THE INVENTION

1. Field of the Invention

The invention relates to a thin film capacitor formed on a semiconductor substrate, and a method of fabricating the same.

2. Description of the Related Art

A conventional thin film capacitor used in a semiconductor integrated circuit such as a dynamic random access memory (DRAM) is generally designed to have a multi-layered structure including upper and lower electrodes composed of polysilicon, a silicon dioxide film and a silicon nitride film.

Recently, as an area of a memory cell has been reduced, there has been a demand of reduction in an area of a capacitor. In order to accomplish a high capacitor density which is required in a high-densiity DRAM as a product to be fabricated after 1Gb DRAM and a chip including both DRAM and a logic circuit, it would be necessary to form a quite thin film, which has a silicon dioxide equivalence thickness of 1 mn or smaller.

One of attempts for accomplishing a high capacity is disclosed in 1995 International Electron Devices Meeting Technical Digest, pp. 119–122. In the suggested attempt, a film having a high dielectric constant, such as a film composed of $SrTiO_3$ having a dielectric constant of about 300 at room temperature or a film composed of $(Ba, Sr)\ TiO_3$ having a dielectric constant of 300 or greater, is used as a capacitor insulating film, and a lower electrode is composed of barrier metal such as Pt/Ta or $RuO_2/Ru/TiN/TiSix$ both of which prevent diffusion of silicon and do not form a layer composed of oxide having a low dielectric constant, even in oxidizing atmosphere established while films having a high dielectric constant are being formed.

There have been reported a lot that it would be possible to fabricate a ferroelectric RAM by using a ferroelectric film composed of ferroelectric substance having ferroelectricity at room temperature, such as $Pb\ (Zr,\ Ti)\ O_3$, in place of $(Ba, Sr)\ TiO_3$.

Electrodes of a thin film capacitor are electrically connected to an electrically conductive layer formed on a semiconductor substrate generally through a contact plug composed of low-resistive contact material filled in a contact hole formed throughout an interlayer insulating film. As the contact material, there is generally used polysilicon into which impurities are doped or tungsten. The contact plug generally has an upper surface which is flat or recessed.

The reason why the upper surface of the contact plug is flat or recessed is derived from a process of fabricating a thin film capacitor. In a conventional process of fabricating a thin film capacitor, a contact hole is first formed throughout an interlayer insulating film, and then, contact material is deposited over the interlayer insulating film to thereby fill the contact hole with the contact material. Thereafter, the contact material is etched back by reactive dry etching or chemical mechanical polishing (CMP) to remove the contact material deposited on the interlayer insulating film. As a result, the contact material filled in the contact hole has an upper surface which is flat or recessed.

If the contact material deposited on the interlayer insulating film is not sufficiently removed, adjacent capacitors would be short-circuited with each other, resulting in malfunction in a circuit. Hence, it is necessary to sufficiently etch the contact material back. As a result, it would be impossible to completely fill the contact hole with the contact material in accordance with dry etching or CMP, resulting in that an upper surface of the contact material filled in the contact hole is flat or recessed.

For instance, a thin film capacitor including a contact plug having a flat upper surface is disclosed in Japanese Unexamined Patent Publications 7-99198, 9-82914, 9-283623, 10-209394 and 10-223848. A thin film capacitor including a contact plug having a recessed upper surface is disclosed, for instance, in Japanese Unexamined Patent Publication No. 10-65001 and Japanese Patent No. 2639355 (Japanese Unexamined Patent Publication No. 8-78519).

A thin film capacitor including a contact plug having a flat or recessed upper surface does not cause any problems while it is being fabricated, but causes a serious problem in annealing steps which are to be carried out when an interlayer insulating film is formed, and then, wiring layers are formed.

For instance, such a serious problem is caused in an annealing step to be carried out at about 400 degrees centigrade in oxygen atmosphere in the case that an interlayer insulating film is composed of $O_3$—TEOS/NSG, or in a lamp annealing step to be carried out at 700 degrees centigrade for about 30 seconds for activating impurity ions in the case that aluminum wiring layers are formed.

Herein, the above-mentioned serious problem caused in an annealing step to be carried out after a thin film capacitor has been fabricated is that a lower electrode peels off a contact plug.

A lower electrode in a thin film capacitor is generally comprised of a thin metal film such as Pt/Ta or $RuO_2/Ru/TiN/TiSi$ both having resistance to oxidation. The thin metal film has a tensile stress when a thin film capacitor is completed. However, if the thin metal film experiences an annealing step at 400 degrees centigrade or greater, a stress in the thin metal film remarkably changes while a temperature is rising, resulting in that a tensile stress is turned into a compressive stress. As a result, the lower electrode comprised of the thin metal film peels off a contact plug composed, for instance, of polysilicon or tungsten.

FIG. 1A illustrates a conventional thin film capacitor, and FIG. 1B illustrates that a lower electrode peels off a contact plug after an annealing step has been carried out.

As illustrated in FIG. 1A, the conventional thin film capacitor is comprised of a silicon substrate 1, an interlayer insulating film 2 formed on the silicon substrate 1, a contact plug 3 filled in a contact hole formed throughout the interlayer insulating film 2, a first lower electrode film 4 formed on the interlayer insulating film 2 covering the contact plug 3, a second lower electrode film 5 formed on the first lower electrode film 4, a capacitor insulating film 6 covering the first and second low electrode films 4 and 5 and the interlayer insulating film 2 therewith, and an upper electrode film 7 formed on the capacitor insulating film 6.

The contact plug 3 in the conventional thin film capacitor has a flat upper surface, as illustrated in FIG. 1A. As mentioned above, a tensile stress is turned into a compressive stress in a part of the first lower electrode film 4 in an annealing step to be carried out after the thin film capacitor has been completed. As a result, a part of the first lower electrode film 4 is upwardly raised, and accordingly, the first lower electrode film 4 peels off the contact plug 3, as indicated with "A" in FIG. 1B.

FIG. 2A illustrates another conventional thin film capacitor, and FIG. 2B illustrates that a lower electrode peels off a contact plug after an annealing step has been carried out.

The contact plug 3 in the thin film capacitor illustrated in FIG. 2A has an upper surface slightly recessed. Hence, a tensile stress in a part of the first lower electrode film 4 is turned into a compressive stress after an annealing step has been carried out, resulting in that the first lower electrode film 4 peels off the contact plug 3, as indicated with "A" in FIG. 2B, in the same way as the thin film capacitor illustrated in FIG. 1A.

If the first lower electrode film 4 peels off the contact plug 3 as illustrated in FIG. 1B, a contact resistance is increased in electrical connection between a transistor formed on the silicon substrate 1 and the thin film capacitor including dielectric substance having a high dielectric constant, resulting in an error such as bit defectiveness in DRAM.

SUMMARY OF THE INVENTION

In view of the above-mentioned problem in the conventional thin film capacitor, it is an object of the present invention to provide a thin film capacitor including a contact plug through which the thin film capacitor is electrically connected to a semiconductor substrate, which capacitor is capable of preventing the contact plug from peeling off a lower electrode even in an annealing step to be carried out after the thin film capacitor has been completed It is also an object of the present invention to provide a method of fabricating such a thin film capacitor.

In one aspect of the present invention, there is provided a thin film capacitor including (a) a semiconductor substrate, (b) an interlayer insulating film formed on the semiconductor substrate, (c) a contact formed throughout the interlayer insulating film such that the contact has an upper surface upwardly projecting, (d) a lower electrode formed on the interlayer insulating film such that the lower electrode covers the upper surface of the contact therewith, (e) a capacitor insulating film covering the lower electrode and the interlayer insulating film therewith, and (f) an upper electrode formed on the capacitor insulating film.

It is preferable that the capacitor insulating film is composed at least partially of any one of $ABO_3$, $(Bi_2O_2)$ $(A_{m-1}B_mO_{3m+1})$ and $Ta_2O_5$, wherein m is an integer ranging from 1 to 5 both inclusive, A in the $ABO_3$ includes at least one of Ba, Sr, Pb, Ca, La, Li and K, B in the $ABO_3$ includes at least one of Zr, Ti, Ta, Nb, Mg, Mn, Fe, Zn and W, A in the $(Bi_2O_2)$ $(A_{m-1}B_mO_{3m+1})$ includes at least one of Ba, Sr, Pb, Ca, K and Bi, and B in the $(Bi_2O_2)$ $(A_{m-1}B_mO_{3m+1})$ includes at least one of Nb, Ta, Ti and W.

It is preferable that the lower electrode is comprised of a first lower electrode film, and a second lower electrode film formed on the first lower electrode film.

It is preferable that the upper electrode and the second lower electrode film are composed of the same material.

There is further provided a thin film capacitor including (a) a semiconductor substrate, (b) a first interlayer insulating film formed on the semiconductor substrate, (c) a contact formed throughout the first interlayer insulating film such that the contact has an upper surface upwardly projecting, (d) a lower electrode formed on the first interlayer insulating film such that the lower electrode covers the upper surface of the contact therewith, (e) a capacitor insulating film formed on the lower electrode, (f) a first upper electrode formed on the capacitor insulating film, (g) a second interlayer insulating film covering the first interlayer insulating film, the lower electrode, the capacitor insulating film and the first upper electrode therewith, the second interlayer insulating film being formed with an opening above the first upper electrode, and (h) a second upper electrode formed on the second interlayer insulating film such that the second upper electrode makes electrical contact with the first upper electrode through the opening of the second interlayer insulating film.

For instance, the first upper electrode may be equal in an area to the capacitor insulating film. As an alternative, the first upper electrode may be smaller in an area than the capacitor insulating film.

There is still further provided a thin film capacitor including (a) a semiconductor substrate, (b) an interlayer insulating film formed on the semiconductor substrate, (c) a contact formed throughout the interlayer insulating film such that the contact has an upper surface upwardly projecting and an extended portion radially extending from the upper surface around the contact on the interlayer insulating film, (d) a lower electrode formed on the interlayer insulating film such that the lower electrode covers of the upper surface and the extended portion of the contact therewith, (e) a capacitor insulating film covering the lower electrode and the interlayer insulating film therewith, and (f) an upper electrode formed on the capacitor insulating film.

There is yet further provided a thin film capacitor including (a) a semiconductor substrate, (b) a first interlayer insulating film formed on the semiconductor substrate, (c) a contact formed throughout the first interlayer insulating film such that the contact has an upper surface upwardly projecting and an extended portion radially extending from the upper surface around the contact on the first interlayer insulating film, (d) a lower electrode formed on the first interlayer insulating film such that the lower electrode covers the upper surface and the extended portion of the contact therewith, (e) a capacitor insulating film formed on the lower electrode, (i) a first upper electrode formed on the capacitor insulating film, (g) a second interlayer insulating film covering the first interlayer insulating film, the lower electrode, the capacitor insulating film and the first upper electrode therewith, the second interlayer insulating film being formed with an opening above the first upper electrode, and (h) a second upper electrode formed on the second interlayer insulating film such that the second upper electrode makes electrical contact with the first upper electrode through the opening of the second interlayer insulating film.

In another aspect of the present invention, there is provided a method of fabricating a thin film capacitor, including the steps of (a) forming an interlayer insulating film on a semiconductor substrate, (b) forming a contact hole throughout the interlayer insulating film, (c) filling the contact hole with contact material, and (d) forming a lower electrode, a capacitor insulating film and an upper electrode in this order on the interlayer insulating film, the step (c) including the step of depositing the contact material in the contact hole such that a resultant contact plug would have an upper surface upwardly projecting.

It is preferable that the step (c) includes the step of etching the contact material back such that a resultant contact plug would exist only on the contact hole, in which case, for instance, the contact material may be etched back by dry etching or chemical mechanical polishing (CMP).

There is further provided a method of fabricating a thin film capacitor, including the steps of (a) forming an interlayer insulating film on a semiconductor substrate, (b) forming a contact hole throughout the interlayer insulating film, (c) filling the contact hole with contact material, and (d) forming a lower electrode, a capacitor insulating film and an upper electrode in this order on the interlayer insulating film, the step (c) including the step of depositing the contact material in the contact hole such that a resultant contact plug would have an upper surface upwardly projecting and an extended portion radially extending from the upper surface around the contact hole on the interlayer insulating film.

There is still further provided a method of fabricating a thin film capacitor, including the steps of (a) forming an interlayer insulating film on a semiconductor substrate, (b) forming a contact hole throughout the interlayer insulating film, (c) filling the contact hole with contact material, and (d) forming a lower electrode, a capacitor insulating film and an upper electrode in this order on the interlayer insulating film, the step (c) including the steps of (c1) depositing the contact material in the contact hole, the contact material having a thickness sufficient to fill the contact hole therewith, (c2) etching the contact material back to thereby fill the contact hole with the contact material, and (c3) growing the contact material such that a resultant contact plug would have an upper surface upwardly projecting.

It is preferable that the step (c) further includes the step of etching the contact material such that the contact material exists only on the contact hole.

There is still yet further provided a method of fabricating a thin film capacitor, including the steps of (a) forming an interlayer insulating film on a semiconductor substrate, (b) forming a contact hole throughout the interlayer insulating film, (c) filling the contact hole with contact material, and (d) forming a lower electrode, a capacitor insulating film and an upper electrode in this order on the interlayer insulating film, the step (c) including the steps of (c1) depositing the contact material in the contact hole, the contact material having a thickness sufficient to fill the contact hole therewith, (c2) etching the contact material back to thereby fill the contact hole with the contact material, and (c3) growing the contact material such that a resultant contact plug would have an upper surface upwardly projecting and an extended portion radially extending from the upper surface around the contact hole on the interlayer insulating film.

The advantages obtained by the aforementioned present invention will be described hereinbelow.

The first advantage is that it is possible to prevent a tensile stress from being changed into a compressive stress in a lower electrode electrically connected to a semiconductor substrate through a contact, and hence, it is also possible to prevent the lower electrode from peeling off the contact.

This is because that the contact is designed to have an upper surface upwardly projecting.

The second advantage is that the thin film capacitor can prevent a contact resistance with a semiconductor substrate from increasing even in annealing steps to be carried out after the thin film capacitor has been completed.

This is because that since the contact has an upper surface upwardly projecting, the lower electrode does not peel off the contact even after the annealing steps.

The third advantage is that it is possible to enhance a fabrication yield of and reliability in a thin film capacitor.

This is because that since the lower electrode does not peel off the contact, there will not occur malfunction in a device including the thin film capacitor.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

[First Embodiment]

Figure 3:
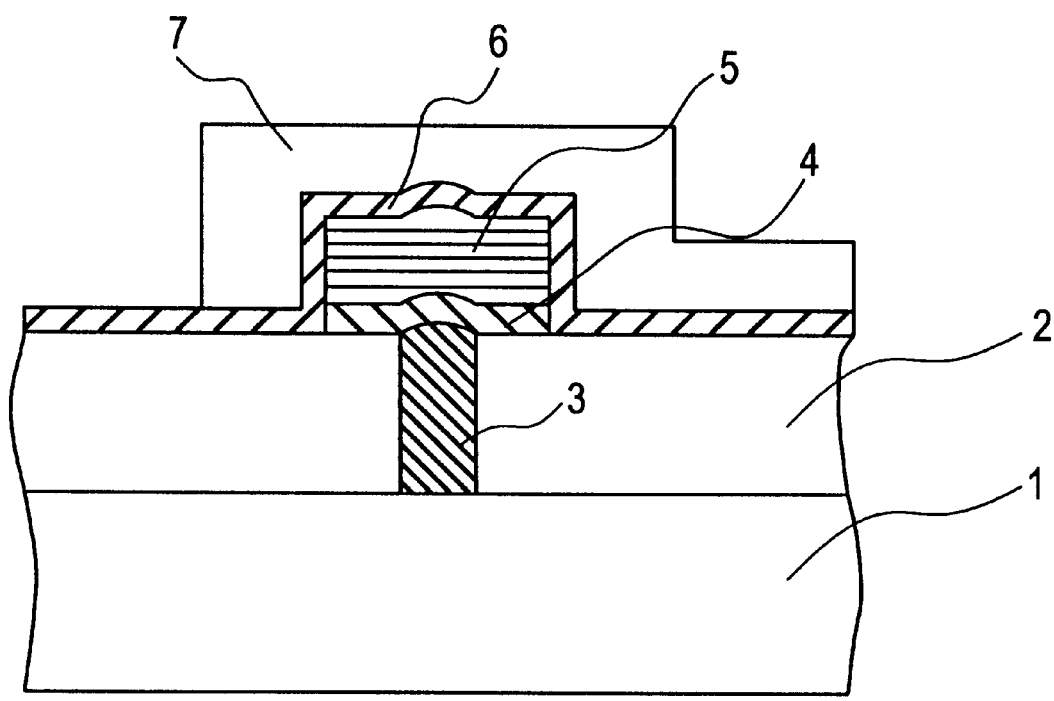
FIG. 3 is a cross-sectional view of a thin film capacitor in accordance with the first embodiment of the present invention.

FIG. 3 is a cross-sectional view of a thin film capacitor in accordance with the first embodiment.

The thin film capacitor in accordance with the first embodiment is comprised of a silicon substrate 1, an interlayer insulating film 2 formed on the silicon substrate 1, a contact plug 3 filled in a contact hole formed throughout the interlayer insulating film 2, a first lower electrode film 4 formed on the interlayer insulating film 2 covering the contact plug 3, a second lower electrode film 5 formed on the first lower electrode film 4, a capacitor insulating film 6 covering the first and second low electrode films 4 and 5 and the interlayer insulating film 2 therewith, and an upper electrode film 7 formed on the capacitor insulating film 6.

The contact plug 3 has an upper surface centrally upwardly projecting.

The interlayer insulating film 2 is composed of $SiO_2$, and the contact plug 3 is composed of polysilicon into which phosphorus is doped. The first lower electrode film 4 is composed of TiN/TiSix, and the second lower electrode 5 film is composed of Ru. The capacitor insulating film 6 is composed of (Ba, Sr) $TiO_3$ having a high dielectric constant, and the upper electrode film 7 is composed of Ru.

Figure 1A:
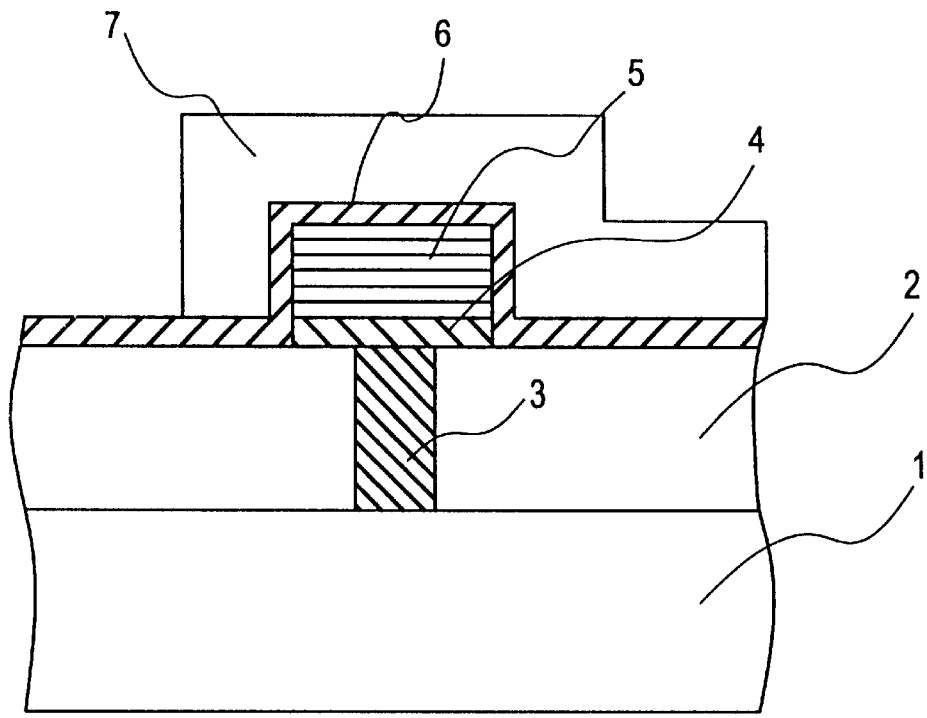
FIG. 1A is a cross-sectional view of a conventional thin film capacitor.
Figure 1B:
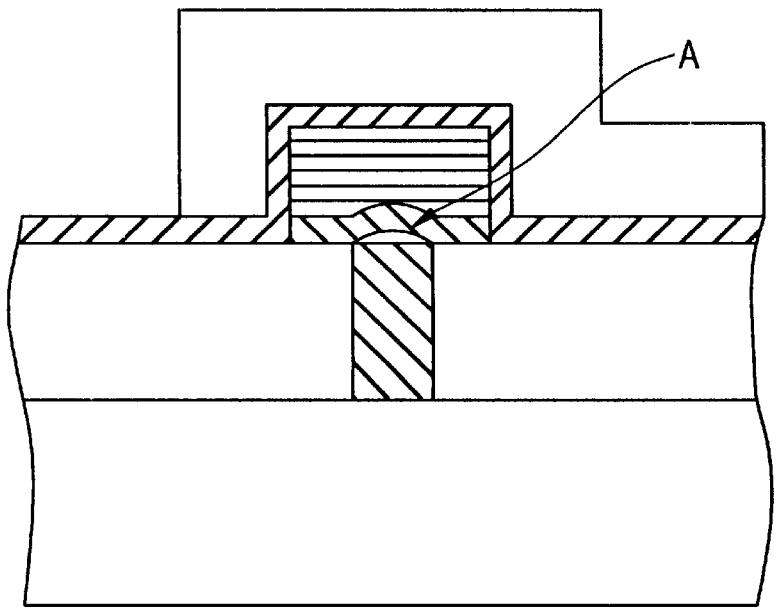
FIG. 1B is a cross-sectional view of the thin film capacitor illustrated in FIG. 1A in which a lower electrode peels off a contact.
Figure 2A:
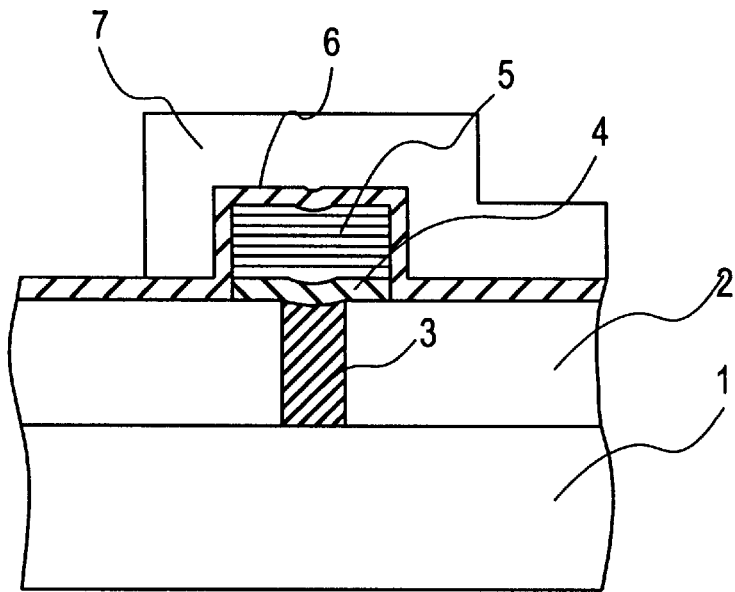
FIG. 2A a cross-sectional view of another conventional thin film capacitor.
Figure 2B:
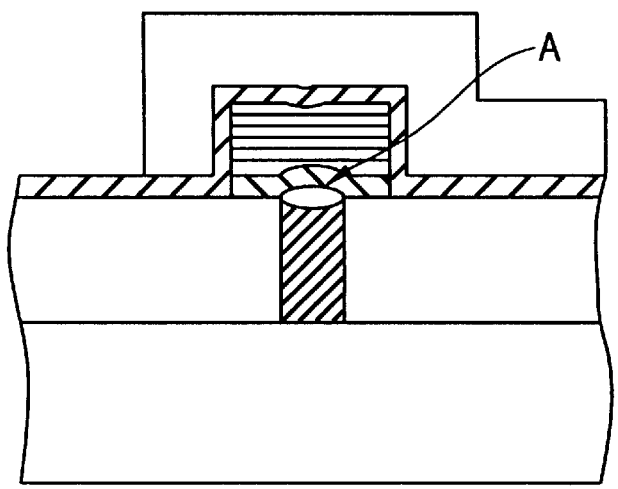
FIG. 2B is a cross-sectional view of the thin film capacitor illustrated in FIG. 2A in which a lower electrode peels off a contact.

As having been explained with reference to FIGS. 1A and 2A, in the conventional thin film capacitor, a tensile stress is turned into a compressive stress in a part of the first lower electrode film 4 after an annealing step has been carried out, and as a result, the first lower electrode film 4 peels off the contact plug 3.

In contrast, since the contact plug 3 has an upper surface which is made in advance to upwardly project in the thin film capacitor in accordance with the first embodiment, a stress generating at an interface between the contact plug 3 and the first lower electrode film 4 is released, and resultingly, the first lower electrode film 4 does not peel off the contact plug 3, even if a tensile stress is turned into a compressive stress in a part of the first lower electrode film 4 in an annealing step carried out after the thin film capacitor has been completed.

Figure 4:
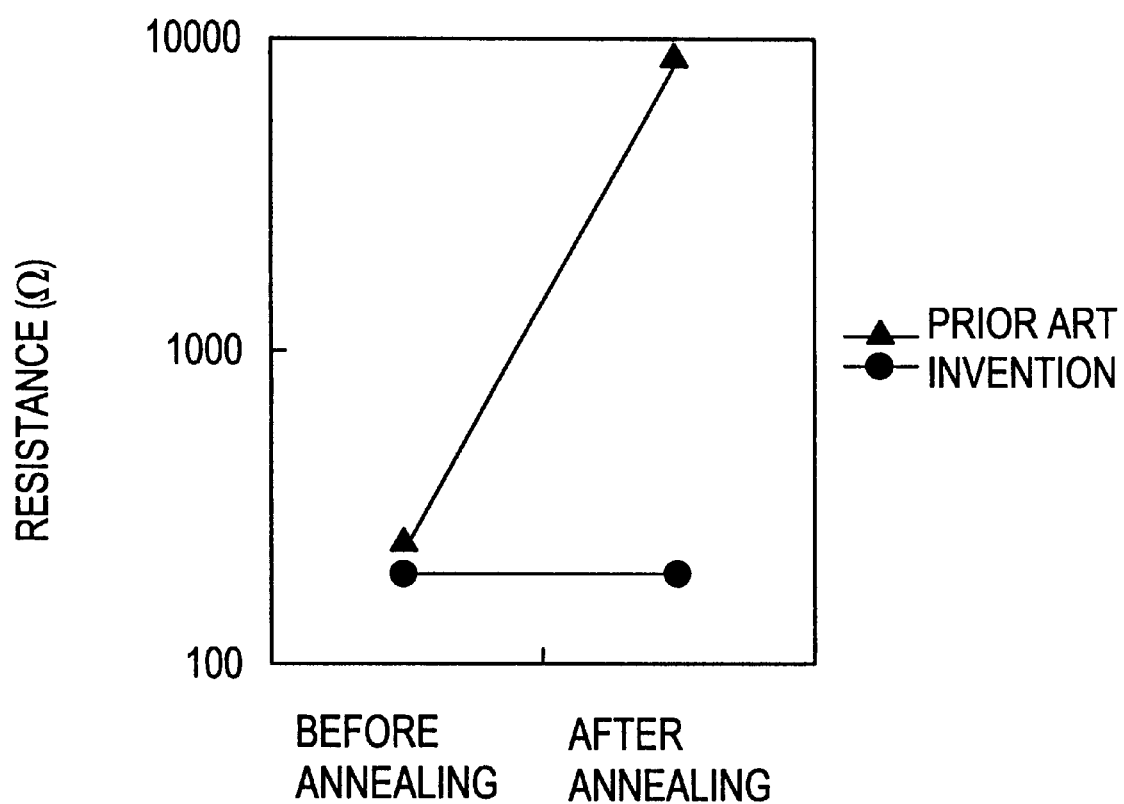
FIG. 4 is a graph showing how a contact resistance between a lower electrode and a contact varies prior to and after an annealing step in both a conventional thin film capacitor and a thin film capacitor in accordance with the first embodiment of the present invention.

FIG. 4 is a graph showing how a contact resistance between the first lower electrode film 4 and the contact plug 3 varies prior to and after an annealing step in both the conventional thin film capacitor and the thin film capacitor in accordance with the first embodiment.

As is understood in view of FIG. 4, the contact resistance in the conventional thin film capacitor is almost equal to the contact resistance in the thin film capacitor in accordance with the first embodiment prior to carrying out an annealing step.

However, the contact resistance in the conventional thin film capacitor remarkably increases after an annealing step has been carried out at 400 degrees centigrade for an hour. As a result, there is caused defectiveness in conductivity of the contact plug 3.

In contrast, in the thin film capacitor in accordance with the first embodiment, the contact resistance measured after the annealing step remains almost equal to the contact resistance measured before the annealing step. This indicates that the first lower electrode film 4 is ensured to keep sufficient electrical connection with the silicon substrate 1 through the contact plug 3.

[Second Embodiment]

Figure 5:
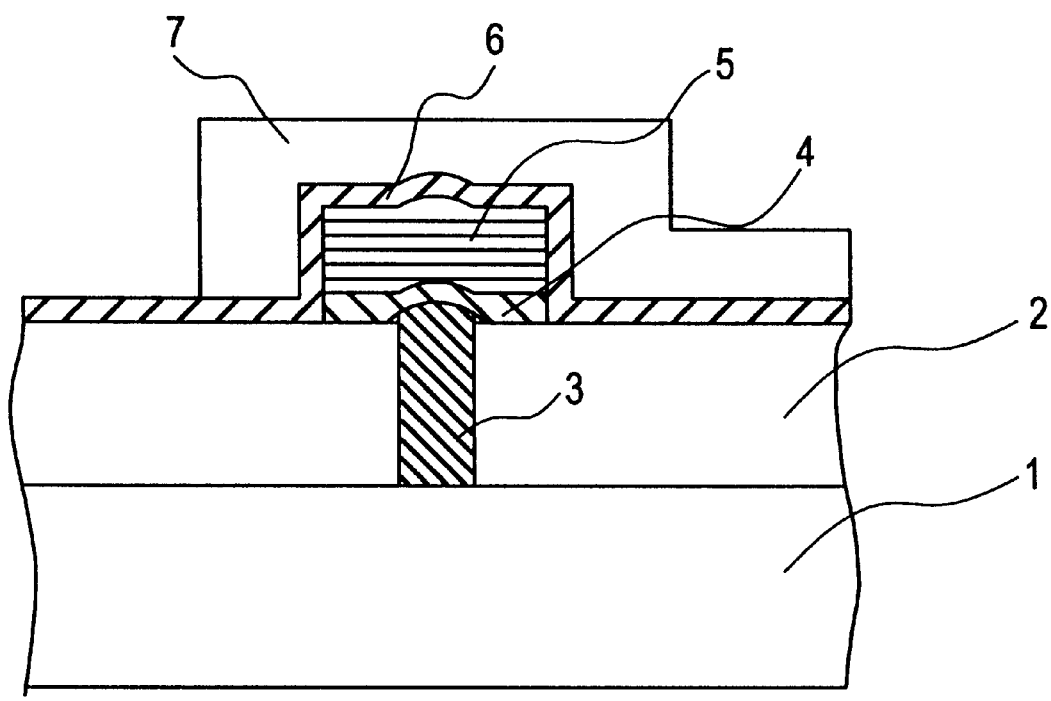
FIG. 5 is a cross-sectional view of a thin film capacitor in accordance with the second embodiment of the present invention.

FIG. 5 is a cross-sectional view of a thin film capacitor in accordance with the second embodiment.

The thin film capacitor in accordance with the first embodiment is comprised of a silicon substrate 1, an interlayer insulating film 2 formed on the silicon substrate 1, a contact plug 3 filled in a contact hole formed throughout the interlayer insulating film 2, a first lower electrode film 4 formed on the interlayer insulating film 2 covering the contact plug 3, a second lower electrode film 5 formed on the first lower electrode film 4, a capacitor insulating film 6 covering the first and second low electrode films 4 and 5 and the interlayer insulating film 2 therewith, and an upper electrode film 7 formed on the capacitor insulating film 6.

The contact plug 3 has an upper surface centrally upwardly projecting and an extended portion radially extending from the upper surface therearound on the interlayer insulating film 2. In other words, the contact plug 3 in the second embodiment has a shape like a screw, in which a shank of the screw is inserted into the contact hole and a head of the screw is laid on the interlayer insulating film 2.

The interlayer insulating film 2 is composed of $SiO_2$, and the contact plug 3 is composed of polysilicon into which phosphorus is doped. The first lower electrode film 4 is composed of TiN/TiSix, and the second lower electrode 5 film is composed of Ru. The capacitor insulating film 6 is composed of (Ba, Sr) $TiO_3$ having a high dielectric constant, and the upper electrode film 7 is composed of Ru.

Since the contact plug 3 has an upper surface which is made in advance to upwardly project, a stress generating at an interface between the contact plug 3 and the first lower electrode film 4 is released, and resultingly, the first lower electrode film 4 does not peel off the contact plug 3, even if a tensile stress is turned into a compressive stress in a part of the first lower electrode film 4 in an annealing step carried out after the thin film capacitor has been completed.

Accordingly, the thin film capacitor in accordance with the second embodiment has a smaller contact resistance and provides higher reliability than the conventional thin film capacitor, as illustrated in FIG. 4.

In addition, since a part of the contact plug 3, that is, the extended portion radially extending from the upper surface, is allowed to lie on the interlayer insulating film 2 in the second embodiment, it would be possible to enhance designability of formation of the contact plug 3 in a horizontal direction. As a result, fabrication cost of the thin film capacitor can be reduced.

[Third Embodiment]

Figure 6:
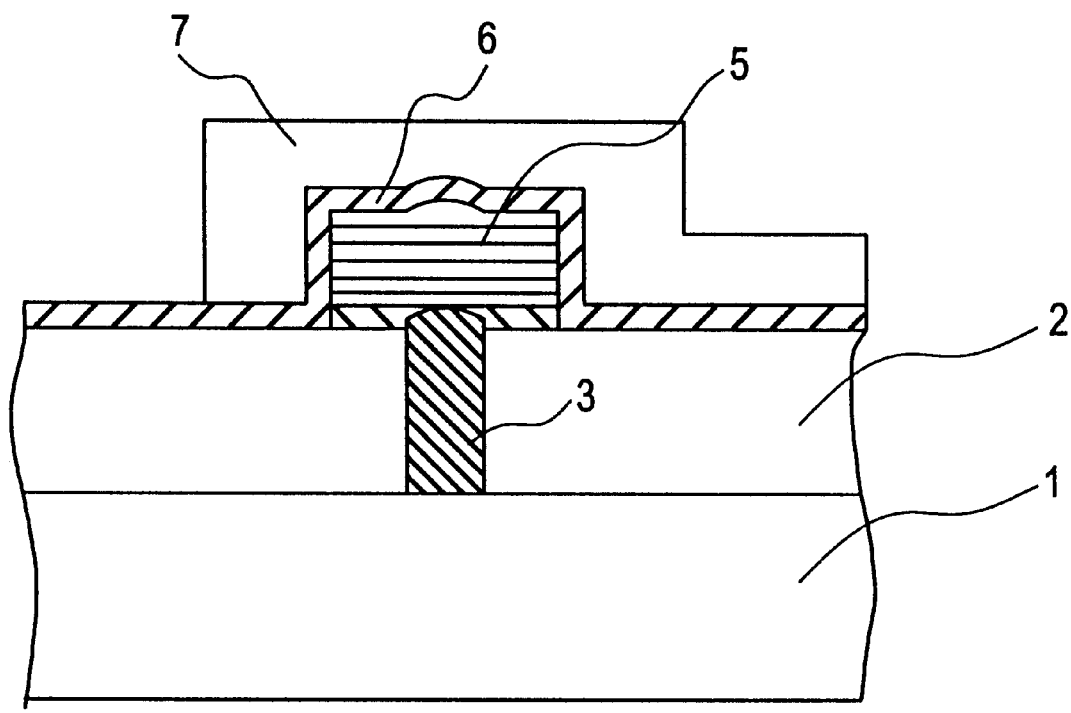
FIG. 6 is a cross-sectional view of a thin film capacitor in accordance with the third embodiment of the present invention.

FIG. 6 is a cross-sectional view of a thin film capacitor in accordance with the third embodiment.

The thin film capacitor in accordance with the third embodiment is structurally different from the thin film capacitor in accordance with the first embodiment, illustrated in FIG. 3, only in that the thin film capacitor in accordance with the third embodiment does not include the first lower electrode film 4, but includes only the second lower electrode film 5.

The contact plug 3 has an upper surface centrally upwardly projecting, similarly to the first embodiment.

Since the contact plug 3 has an upper surface which is made in advance to upwardly project, a stress generating at an interface between the contact plug 3 and the second lower electrode film 5 is released, and resultingly, the second lower electrode film 5 does not peel off the contact plug 3, even if a tensile stress is turned into a compressive stress in a part of the second lower electrode film 5 in an annealing step carried out after the thin film capacitor has been completed.

[Fourth Embodiment]

Figure 7:
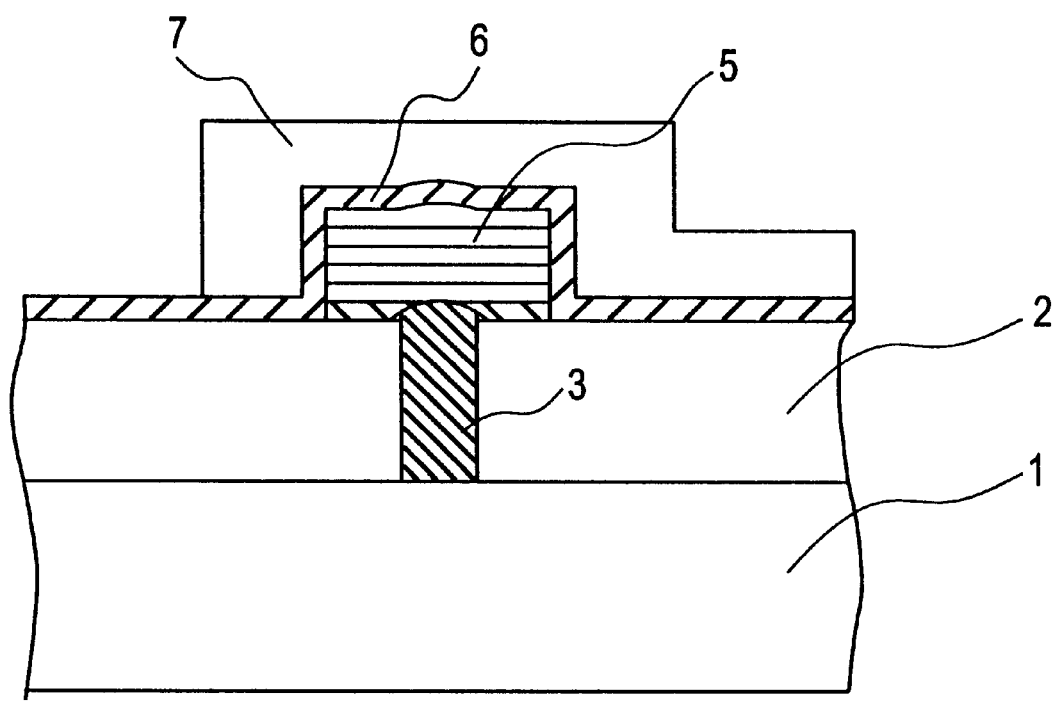
FIG. 7 is a cross-sectional view of a thin film capacitor in accordance with the fourth embodiment of the present invention.

FIG. 7 is a cross-sectional view of a thin film capacitor in accordance with the fourth embodiment.

The thin film capacitor in accordance with the fourth embodiment is structurally different from the thin film capacitor in accordance with the second embodiment, illustrated in FIG. 5, only in that the thin film capacitor in accordance with the fourth embodiment does not include the first lower electrode film 4, but includes only the second lower electrode film 5.

The contact plug 3 has an upper surface centrally upwardly projecting and an extended portion radially extending from the upper surface therearound on the interlayer insulating film 2, similarly to the second embodiment.

Since the contact plug 3 has an upper surface which is made in advance to upwardly project, a stress generating at an interface between the contact plug 3 and the second lower electrode film 5 is released, and resultingly, the second lower electrode film 5 does not peel off the contact plug 3, even if a tensile stress is turned into a compressive stress in a part of the second lower electrode film 5 in an annealing step carried out after the thin film capacitor has been completed.

In addition, since a part of the contact plug 3, that is, the extended portion radially extending from the upper surface, is allowed to lie on the interlayer insulating film 2, it would be possible to enhance designability of formation of the contact plug 3 in a horizontal direction. As a result, fabrication cost of the thin film capacitor can be reduced.

[Fifth Embodiment]

Figure 8:
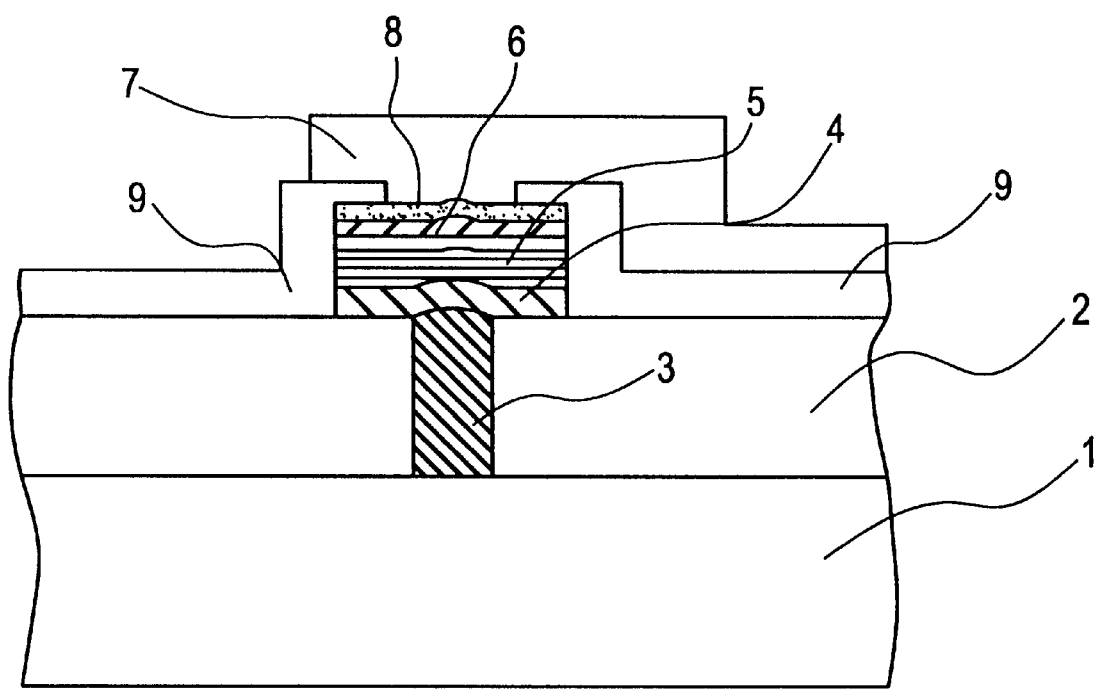
FIG. 8 is a cross-sectional view of a thin film capacitor in accordance with the fifth embodiment of the present invention.

FIG. 8 is a cross-sectional view of a thin film capacitor in accordance with the fifth embodiment.

The thin film capacitor in accordance with the fifth embodiment is comprised of a silicon substrate 1, a first interlayer insulating film 2 formed on the silicon substrate 1, a contact plug 3 formed throughout the first interlayer insulating film 2, a first lower electrode film 4 formed on the first interlayer insulating film 2 such that the first lower electrode film 4 covers an upper surface of the contact plug 3 therewith, a second lower electrode film 5 formed on the first lower electrode film 4, a capacitor insulating film 6 formed on the second lower electrode film 5, a first upper electrode film 8 formed on the capacitor insulating film 6, a second interlayer insulating film 9 covering the first interlayer insulating film 2, the first lower electrode film 4, the second lower electrode film 5, the capacitor insulating film 6 and the first upper electrode film 8 therewith, and being formed with an opening above the first upper electrode film 8, and a second upper electrode film 7 formed on the second interlayer insulating film 9 such that the second upper electrode film 7 makes electrical contact with the first upper electrode film 8 through the opening of the second interlayer insulating film 9.

The contact plug 3 has an upper surface centrally upwardly projecting, similarly to the first embodiment.

The first interlayer insulating film 2 is composed of $SiO_2$, and the contact plug 3 is composed of polysilicon into which phosphorus is doped. The first lower electrode film 4 is composed of TiN/TiSix, and the second lower electrode 5 film is composed of Pt. The capacitor insulating film 6 is composed of Pb (Zr, Ti) $O_3$ having a ferroelectric property. The first upper electrode film 8 is composed of $Ir/IrO_2$, and the second upper electrode film 7 is composed of WSi.

The structure of the thin film capacitor in accordance with the fifth embodiment is particularly preferable for having proper capacitor characteristic, if the capacitor insulating film 6 has poor coverage.

Since the contact plug 3 has an upper surface which is made in advance to upwardly project, a stress generating at an interface between the contact plug 3 and the first lower electrode film 4 is released, and resultingly, the first lower electrode film 4 does not peel off the contact plug 3, even if a tensile stress is turned into a compressive stress in a part of the first lower electrode film 4 in an annealing step carried out after the thin film capacitor has been completed.

[Sixth Embodiment]

Figure 9:
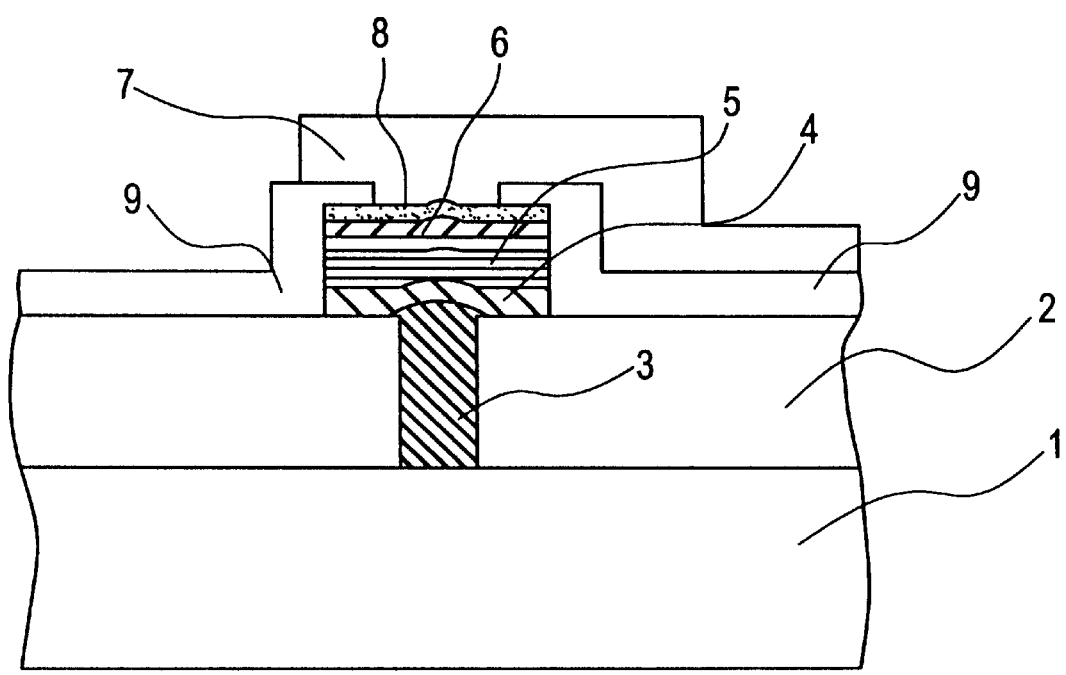
FIG. 9 is a cross-sectional view of a thin film capacitor in accordance with the sixth embodiment of the present invention.

FIG. 9 is a cross-sectional view of a thin film capacitor in accordance with the sixth embodiment.

The thin film capacitor in accordance with the sixth embodiment is comprised of a silicon substrate 1, a first interlayer insulating film 2 formed on the silicon substrate 1, a contact plug 3 formed throughout the first interlayer insulating film 2, a first lower electrode film 4 formed on the first interlayer insulating film 2 such that the first lower electrode film 4 covers an upper surface of the contact plug 3 therewith, a second lower electrode film 5 formed on the first lower electrode film 4, a capacitor insulating film 6 formed on the second lower electrode film 5, a first upper electrode film 8 formed on the capacitor insulating film 6, a second interlayer insulating film 9 covering the first interlayer insulating film 2, the first lower electrode film 4, the second lower electrode film 5, the capacitor insulating film 6 and the first upper electrode film 8 therewith, and being formed with an opening above the first upper electrode film 8, and a second upper electrode film 7 formed on the second interlayer insulating film 9 such that the second upper electrode film 7 makes electrical contact with the first upper electrode film 8 through the opening of the second interlayer insulating film 9.

The contact plug 3 has an upper surface centrally upwardly projecting and an extended portion radially extending from the upper surface therearound on the interlayer insulating film 2, similarly to the second embodiment.

The first interlayer insulating film 2 is composed of $SiO_2$, and the contact plug 3 is composed of polysilicon into which phosphorus is doped. The first lower electrode film 4 is composed of TiN/TiSix, and the second lower electrode 5 film is composed of Pt. The capacitor insulating film 6 is composed of Pb (Zr, Ti) $O_3$ having a ferroelectric property. The first upper electrode film 8 is composed of $Ir/IrO_2$, and the second upper electrode film 7 is composed of WSi.

Since the contact plug 3 has an upper surface which is made in advance to upwardly project, a stress generating at an interface between the contact plug 3 and the first lower electrode film 4 is released, and resultingly, the first lower electrode film 4 does not peel off the contact plug 3, even if a tensile stress is turned into a compressive stress in a part of the first lower electrode film 4 in an annealing step carried out after the thin film capacitor has been completed.

In addition, since a part of the contact plug 3, that is, the extended portion radially extending from the upper surface, is allowed to lie on the first interlayer insulating film 2, it would be possible to enhance designability of formation of the contact plug 3 in a horizontal direction. As a result, fabrication cost of the thin film capacitor can be reduced.

[Seventh Embodiment]

Figure 10:
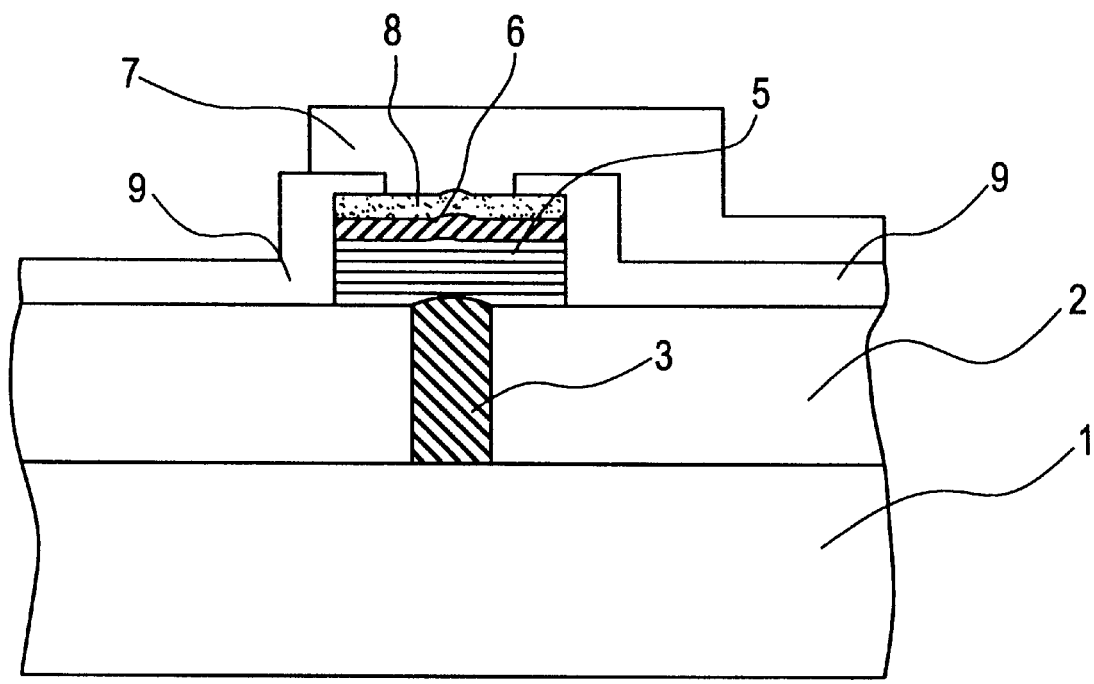
FIG. 10 is a cross-sectional view of a thin film capacitor in accordance with the seventh embodiment of the present invention.

FIG. 10 is a cross-sectional view of a thin film capacitor in accordance with the seventh embodiment.

The thin film capacitor in accordance with the seventh embodiment is structurally different from the thin film capacitor in accordance with the fifth embodiment, illustrated in FIG. 8, only in that the thin film capacitor in accordance with the seventh embodiment does not include the first lower electrode film 4, but includes only the second lower electrode film 5, and in that the second lower electrode film 5 is composed of Ir.

The contact plug 3 has an upper surface centrally upwardly projecting, similarly to the fifth embodiment.

Since the contact plug 3 has an upper surface which is made in advance to upwardly project, a stress generating at an interface between the contact plug 3 and the second lower electrode film 5 is released, and resultingly, the second lower electrode film 5 does not peel off the contact plug 3, even if a tensile stress is turned into a compressive stress in a part of the second lower electrode film 5 in an annealing step carried out after the thin film capacitor has been completed.

[Eighth Embodiment]

Figure 11:
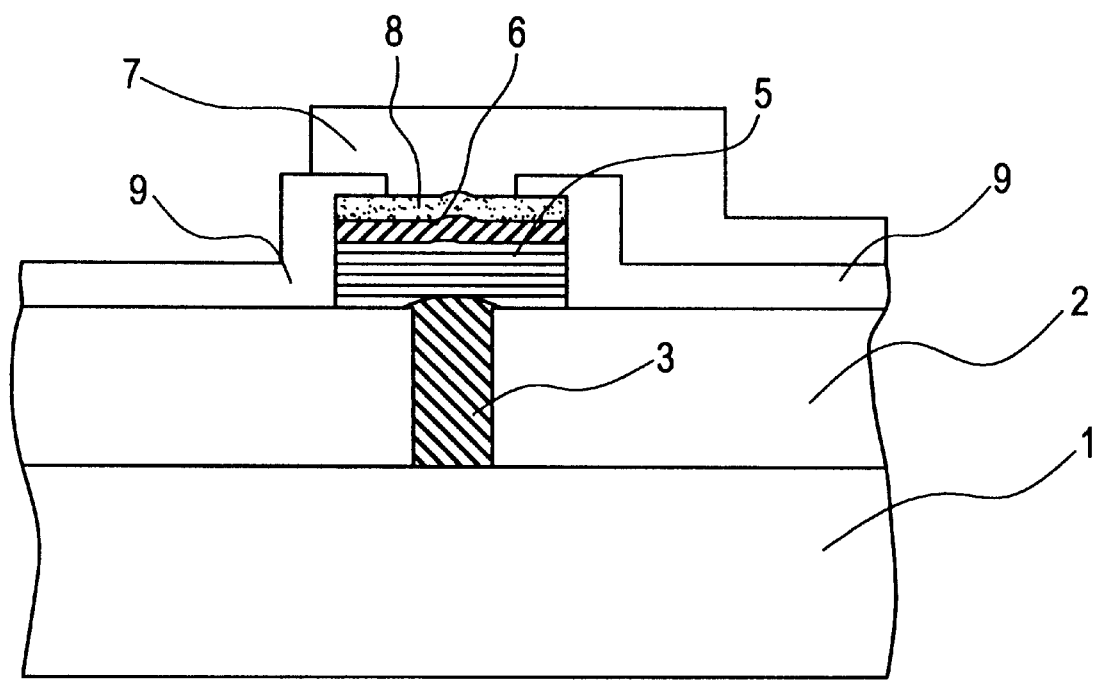
FIG. 11 is a cross-sectional view of a thin film capacitor in accordance with the eighth embodiment of the present invention.

FIG. 11 is a cross-sectional view of a thin film capacitor in accordance with the eighth embodiment.

The thin film capacitor in accordance with the eighth embodiment is structurally different from the thin film capacitor in accordance with the sixth embodiment, illustrated in FIG. 9, only in that the thin film capacitor in accordance with the eighth embodiment does not include the first lower electrode film 4, but includes only the second lower electrode film 5, and in that the second lower electrode film 5 is composed of Ir.

The contact plug 3 has an upper surface centrally upwardly projecting and an extended portion radially extending from the upper surface therearound on the interlayer insulating film 2, similarly to the sixth embodiment.

Since the contact plug 3 has an upper surface which is made in advance to upwardly project, a stress generating at an interface between the contact plug 3 and the second lower electrode film 5 is released, and resultingly, the second lower electrode film 5 does not peel off the contact plug 3, even if a tensile stress is turned into a compressive stress in a part of the second lower electrode film 5 in an annealing step carried out after the thin film capacitor has been completed.

In addition, since a part of the contact plug 3, that is, the extended portion radially extending from the upper surface, is allowed to lie on the first interlayer insulating film 2, it would be possible to enhance designability of formation of the contact plug 3 in a horizontal direction in comparison with the seventh embodiment. As a result, fabrication cost of the thin film capacitor can be reduced.

[Ninth Embodiment]

Figure 12:
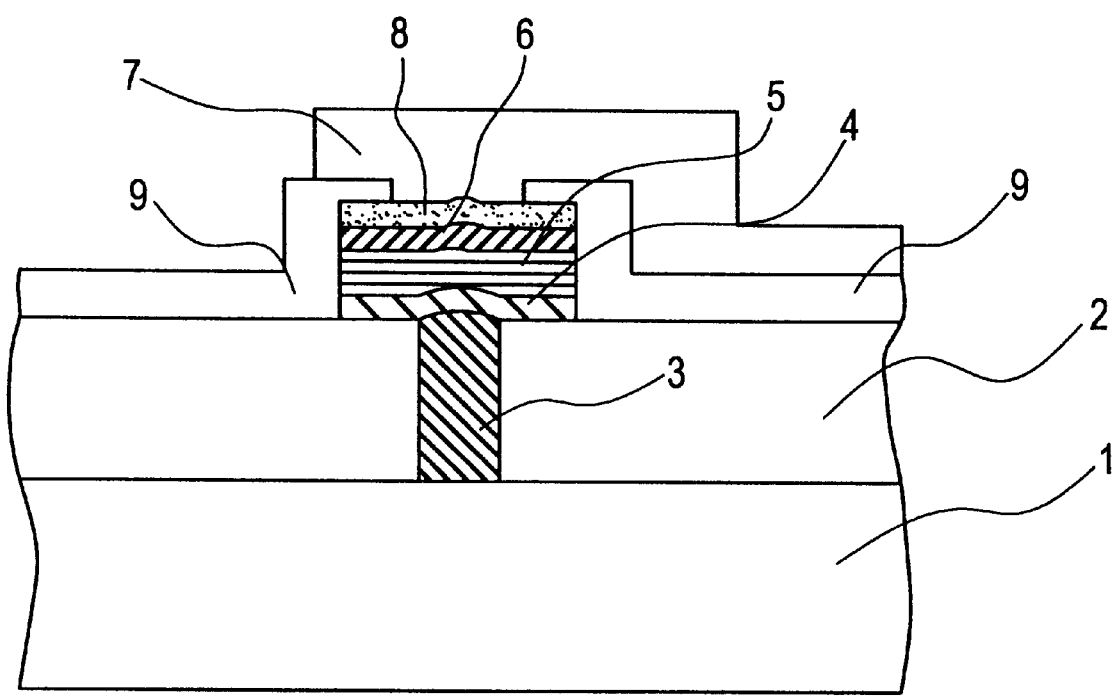
FIG. 12 is a cross-sectional view of a thin film capacitor in accordance with the ninth embodiment of the present invention.

FIG. 12 is a cross-sectional view of a thin film capacitor in accordance with the ninth embodiment.

The thin film capacitor in accordance with the ninth embodiment is structurally different from the thin film capacitor in accordance with the fifth embodiment, illustrated in FIG. 8, only in that the first upper electrode film 8 is smaller in an area than the capacitor insulating film 6 and the first and second lower electrode films 4 and 5.

The contact plug 3 has an upper surface centrally upwardly projecting, similarly to the fifth embodiment.

Since the contact plug 3 has an upper surface which is made in advance to upwardly project, a stress generating at an interface between the contact plug 3 and the second lower electrode film 5 is released, and resultingly, the second lower electrode film 5 does not peel off the contact plug 3, even if a tensile stress is turned into a compressive stress in a part of the second lower electrode film 5 in an annealing step carried out after the thin film capacitor has been completed.

[Tenth Embodiment]

Figure 13:
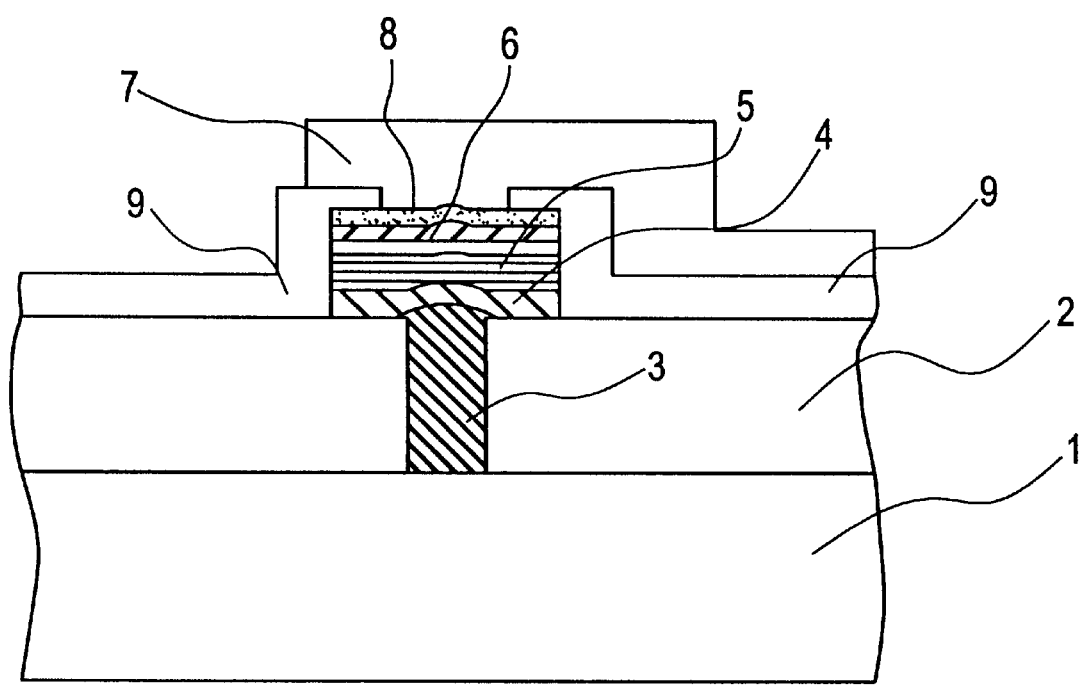
FIG. 13 is a cross-sectional view of a thin film capacitor in accordance with the tenth embodiment of the present invention.

FIG. 13 is a cross-sectional view of a thin film capacitor in accordance with the tenth embodiment.

The thin film capacitor in accordance with the tenth embodiment is structurally different from the thin film capacitor in accordance with the sixth embodiment, illustrated in FIG. 9, only in that the first upper electrode film 8 is smaller in an area than the capacitor insulating film 6 and the first and second lower electrode films 4 and 5.

The contact plug 3 has an upper surface centrally upwardly projecting and an extended portion radially extending from the upper surface therearound on the interlayer insulating film 2, similarly to the sixth embodiment.

Since the contact plug 3 has an upper surface which is made in advance to upwardly project, a stress generating at an interface between the contact plug 3 and the second lower electrode film 5 is released, and resultingly, the second lower electrode film 5 does not peel off the contact plug 3, even if a tensile stress is turned into a compressive stress in a part of the second lower electrode film 5 in an annealing step carried out after the thin film capacitor has been completed.

In addition, since a part of the contact plug 3, that is, the extended portion radially extending from the upper surface, is allowed to lie on the first interlayer insulating film 2, it would be possible to enhance designability of formation of the contact plug 3 in a horizontal direction in comparison with the ninth embodiment. As a result, fabrication cost of the thin film capacitor can be reduced.

[Eleventh Embodiment]

Figure 14:
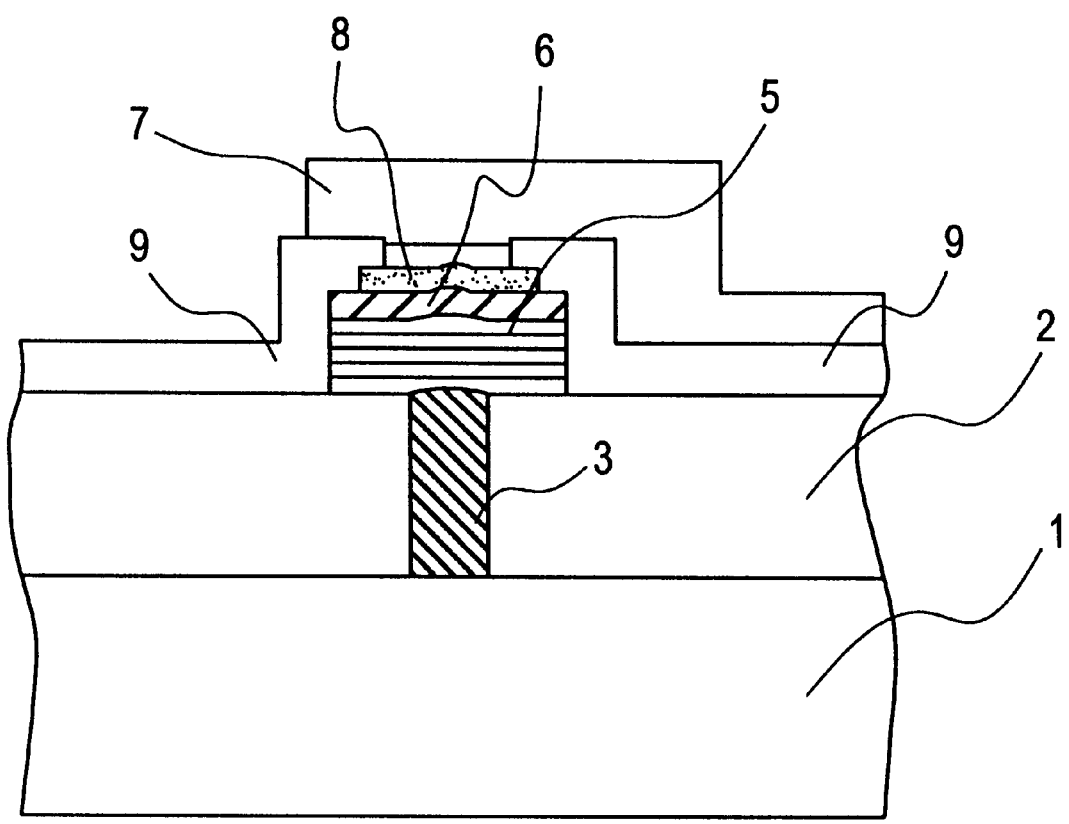
FIG. 14 is a cross-sectional view of a thin film capacitor in accordance with the eleventh embodiment of the present invention.

FIG. 14 is a cross-sectional view of a thin film capacitor in accordance with the eleventh embodiment.

The thin film capacitor in accordance with the eleventh embodiment is structurally different from the thin film capacitor in accordance with the ninth embodiment, illustrated in FIG. 12, only in that the thin film capacitor in accordance with the eleventh embodiment does not include the first lower electrode film 4, but includes only the second lower electrode film 5, and in that the second lower electrode film 5 is composed of Ir.

The contact plug 3 has an upper surface centrally upwardly projecting, similarly to the ninth embodiment.

Since the contact plug 3 has an upper surface which is made in advance to upwardly project, a stress generating at an interface between the contact plug 3 and the second lower electrode film 5 is released, and resultingly, the second lower electrode film 5 does not peel off the contact plug 3, even if a tensile stress is turned into a compressive stress in a part of the second lower electrode film 5 in an annealing step carried out after the thin film capacitor has been completed.

[Twelfth Embodiment]

Figure 15:
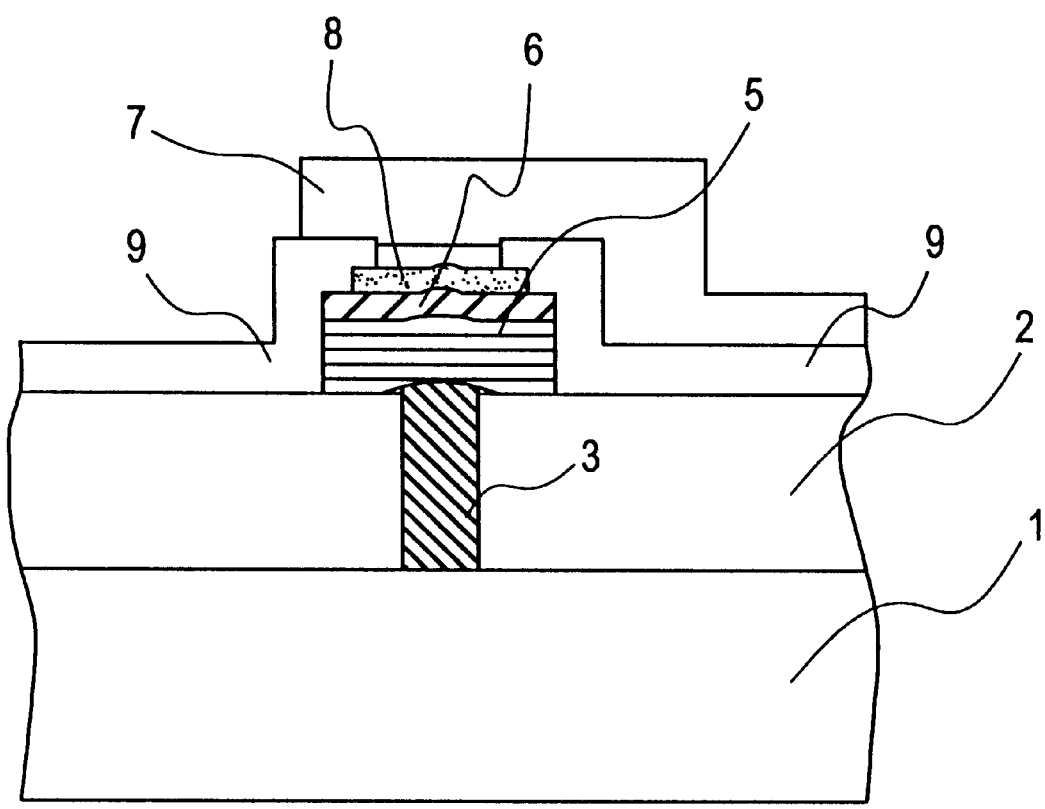
FIG. 15 is a cross-sectional view of a thin film capacitor in accordance with the twelfth embodiment of the present invention.

FIG. 15 is a cross-sectional view of a thin film capacitor in accordance with the twelfth embodiment.

The thin film capacitor in accordance with the twelfth embodiment is structurally different from the thin film capacitor in accordance with the tenth embodiment, illustrated in FIG. 13, only in that the thin film capacitor in accordance with the twelfth embodiment does not include the first lower electrode film 4, but includes only the second lower electrode film 5, and in that the second lower electrode film 5 is composed of Ir.

The contact plug 3 has an upper surface centrally upwardly projecting and an extended portion radially extending from the upper surface therearound on the interlayer insulating film 2, similarly to the tenth embodiment.

Since the contact plug 3 has an upper surface which is made in advance to upwardly project, a stress generating at an interface between the contact plug 3 and the second lower electrode film 5 is released, and resultingly, the second lower electrode film 5 does not peel off the contact plug 3, even if a tensile stress is turned into a compressive stress in a part of the second lower electrode film 5 in an annealing step carried out after the thin film capacitor has been completed.

In addition, since a part of the contact plug 3, that is, the extended portion radially extending from the upper surface, is allowed to lie on the first interlayer insulating film 2, it would be possible to enhance designability of formation of the contact plug 3 in a horizontal direction in comparison with the eleventh embodiment. As a result, fabrication cost of the thin film capacitor can be reduced.

[Thirteenth Embodiment]

FIGS. 16A to 16F are cross-sectional views of a thin film capacitor, illustrating respective steps of a method of fabricating the same, in accordance with the thirteenth embodiment.

The thin film capacitor in accordance with the first embodiment, illustrated in FIG. 3, is fabricated by the method in accordance with the thirteenth embodiment.

Figure 16A:
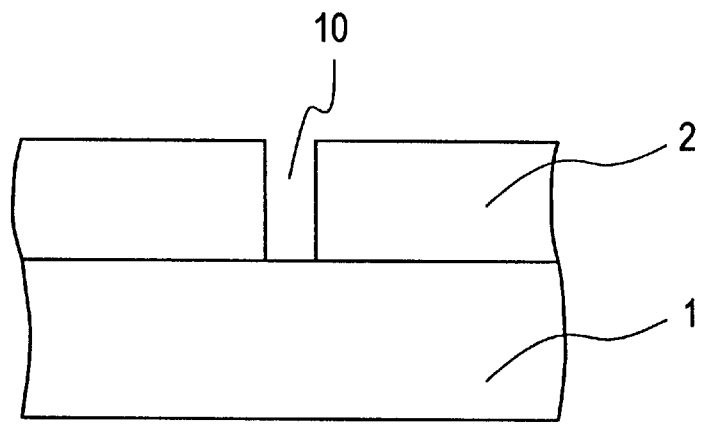
FIGS. 16A to 16F are cross-sectional views of a thin film capacitor illustrating respective steps of a method of fabricating the same, in accordance with the thirteenth embodiment of the present invention.

First, as illustrated in FIG. 16A, an interlayer insulating film 2 composed of $SiO_2$ is formed on a silicon substrate 1. Then, a contact hole 10 is formed throughout the interlayer insulating film 2.

Figure 16B:
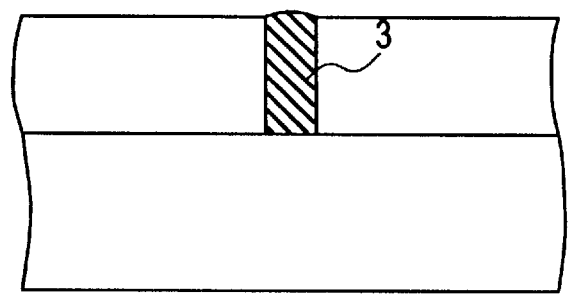

Then, as illustrated in FIG. 16B, contact material is filled in the contact hole 10 to thereby form a contact plug 3. Specifically, the contact plug 3 is formed by growing silicon only in the contact hole 10, and ion-implanting phosphorus into the silicon to thereby activate the silicon. By virtue of this selective growth of the silicon, the contact plug 3 has an upper surface upwardly projecting.

Figure 16C:
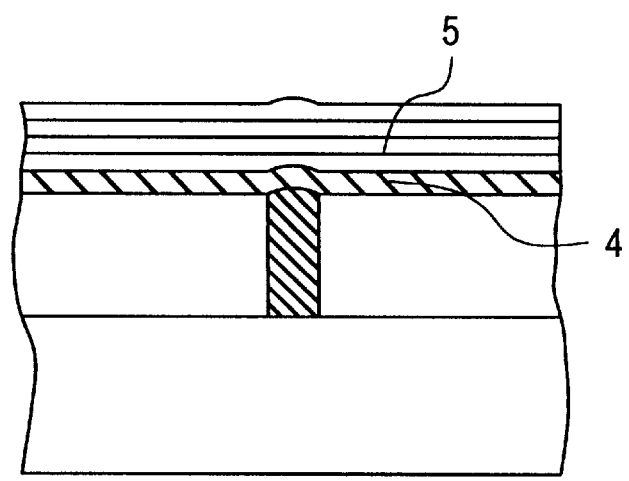

Then, as illustrated in FIG. 16C, a first lower electrode film 4 composed of TiN/TiSix is deposited on both the interlayer insulating film 2 and the contact plug 3, and thereafter, a second lower electrode film 5 composed of Ru is deposited on the first lower electrode film 4. Since the first and second lower electrode films 4 and 5 are deposited on the contact plug 3, an interface between the contact plug 3 and the first and second lower electrode films 4 and 5 upwardly projects, as illustrated in FIG. 16C.

Figure 16D:
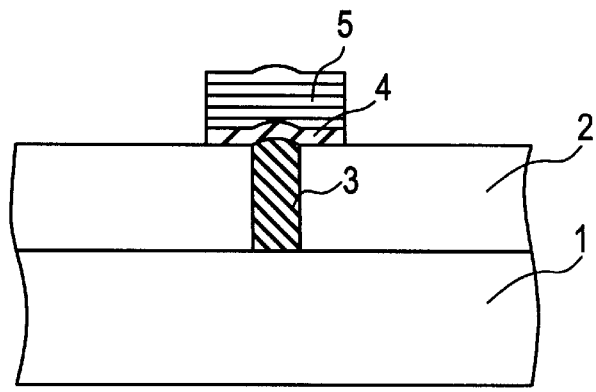

Then, the first and second lower electrode films 4 and 5 are patterned into a desired shape such that the patterned first and second lower electrode films 4 and 5 covers the upper surface of the contact plug 3 therewith, as illustrated in FIG. 16D.

Figure 16E:
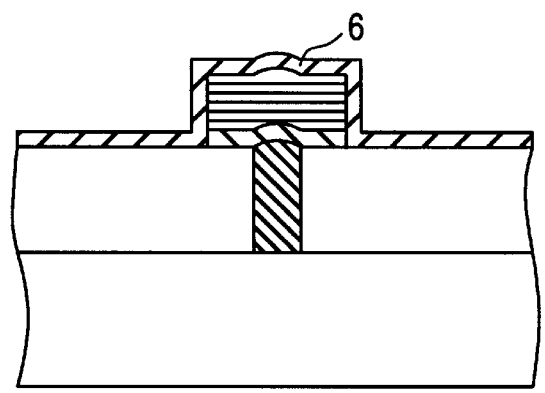

Then, as illustrated in FIG. 16E, a capacitor insulating film 6 composed of (Ba, Sr) $TiO_3$ having a high dielectric constant is deposited on all over the product resulted from the previous step.

Figure 16F:
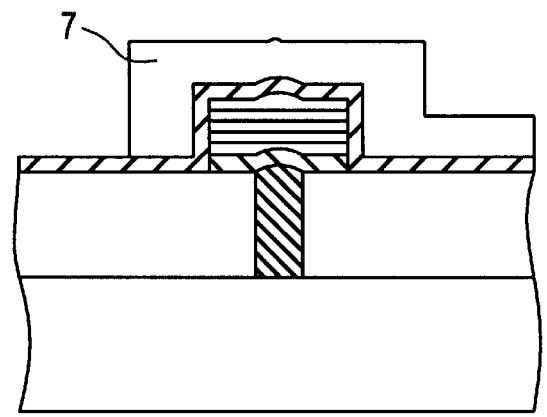

Then, as illustrated in FIG. 16F, an upper electrode film 7 composed of Ru is deposited on all over the product illustrated in FIG. 16E, and then, is patterned into a desired pattern.

Thus, there is completed the thin film capacitor in accordance with the first embodiment, illustrated in FIG. 3.

In the thin film capacitor fabricated by the method in accordance with the thirteenth embodiment, since the contact plug 3 has an upper surface which is made in advance to upwardly project, a stress generating at an interface between the contact plug 3 and the first lower electrode film 4 is released, and resultingly, the first lower electrode film 4 does not peel off the contact plug 3, even if a tensile stress is turned into a compressive stress in a part of the first lower electrode film 4 in an annealing step carried out after the thin film capacitor has been completed.

[Fourteenth Embodiment]

FIGS. 17A to 17G are cross-sectional views of a thin film capacitor, illustrating respective steps of a method of fabricating the same, in accordance with the fourteenth embodiment.

The thin film capacitor in accordance with the second embodiment, illustrated in FIG. 4, is fabricated by the method in accordance with the fourteenth embodiment.

Figure 17A:
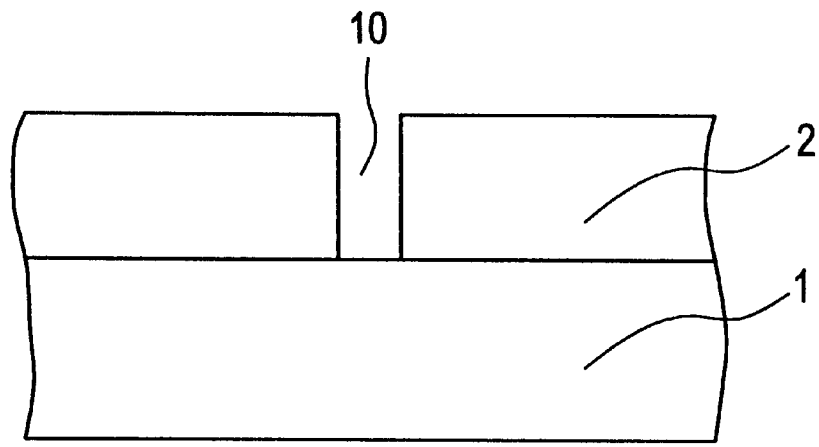
FIGS. 17A to 17G are cross-sectional views of a thin film capacitor illustrating respective steps of a method of fabricating the same, in accordance with the fourteenth embodiment of the present invention.

First, as illustrated in FIG. 17A, an interlayer insulating film 2 composed of $SiO_2$ is formed on a silicon substrate 1. Then, a contact hole 10 is formed throughout the interlayer insulating film 2.

Figure 17B:
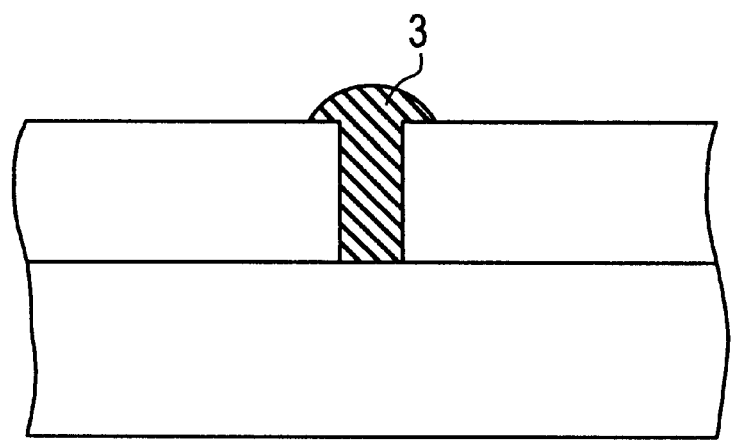

Then, as illustrated in FIG. 17B, contact material is filled in the contact hole 10 to thereby form a contact plug 3. Specifically, the contact plug 3 is formed by growing silicon only in the contact hole 10. When the silicon is grown in the contact hole 10, the silicon is designed to have a thickness slightly greater than a depth of the contact hole 10. As a result, the silicon horizontally grows radially around the contact hole 10 on the interlayer insulating film 2. Thus, the contact plug 3 has an upper surface centrally upwardly projecting and an extended portion radially extending from the upper surface therearound on the interlayer insulating film 2, as illustrated in FIG. 17B.

Then, phosphorus is ion-implanted into the silicon to thereby activate the silicon.

Figure 17C:
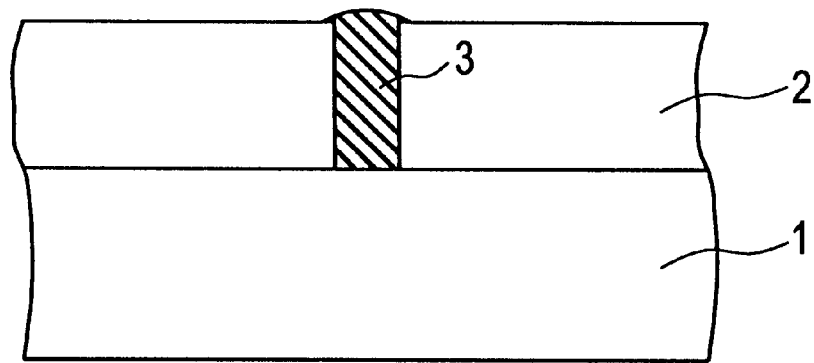

Then, as illustrated in FIG. 17C, the silicon is etched back. As a result, the silicon remains above and around the contact hole 10 such that the upper surface of the silicon is kept to upwardly project.

Even if the silicon slightly remains on the interlayer insulating film 2, there is not caused any problems with respect to an operation of the thin film capacitor.

Figure 17D:
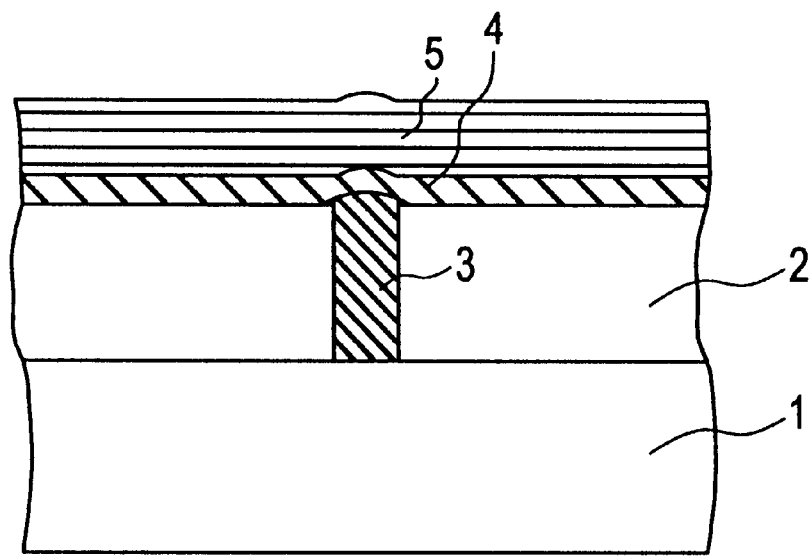

Then, as illustrated in FIG. 17D, a first lower electrode film 4 composed of TiN/TiSix is deposited on both the interlayer insulating film 2 and the contact plug 3, and thereafter, a second lower electrode film 5 composed of Ru is deposited on the first lower electrode film 4. Since the first and second lower electrode films 4 and 5 are deposited on the contact plug 3, an interface between the contact plug 3 and the first and second lower electrode films 4 and 5 upwardly projects, as illustrated in FIG. 17D.

Figure 17E:
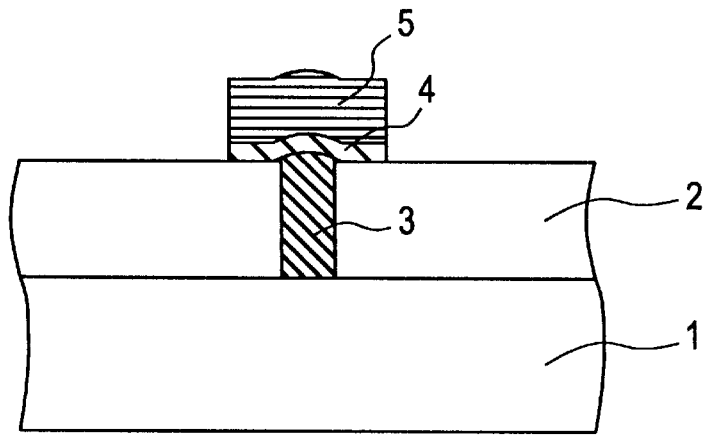

Then, the first and second lower electrode films 4 and 5 are patterned into a desired shape such that the patterned first and second lower electrode films 4 and 5 covers the upper surface of the contact plug 3 therewith, as illustrated in FIG. 17E.

Figure 17F:
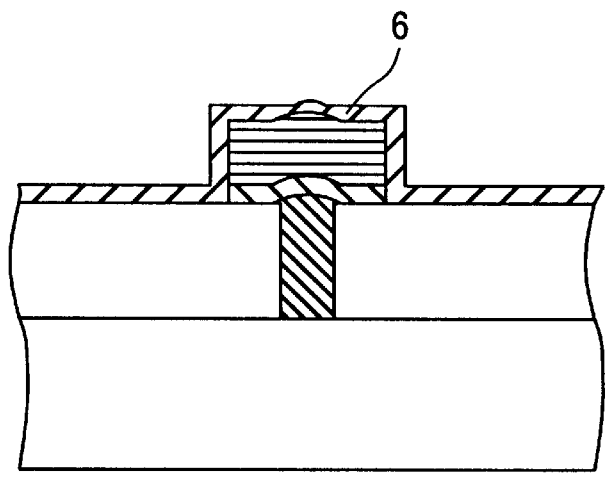

Then, as illustrated in FIG. 17F, a capacity insulating film 6 composed of (Ba, Sr) $TiO_3$ having a high dielectric constant is deposited all over the product resulted from the previous step.

Figure 17G:
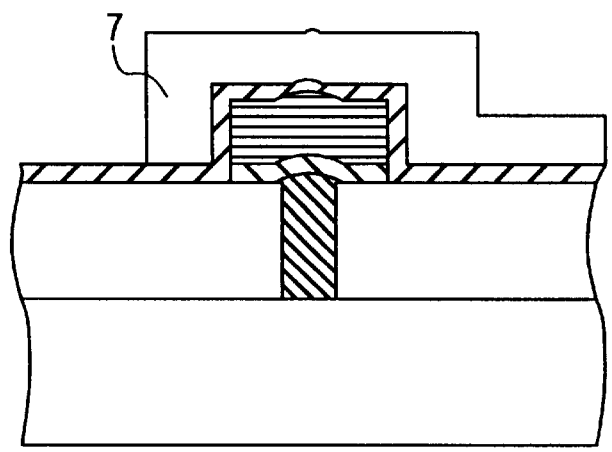

Then, as illustrated in FIG. 17G, an upper electrode film 7 composed of Ru is deposited all over the product illustrated in FIG. 17F, and then, is patterned into a desired pattern.

Thus, there is completed the thin film capacitor in accordance with the second embodiment, illustrated in FIG. 5.

In the thin film capacitor fabricated by the method in accordance with the fourteenth embodiment, since the contact plug 3 has an upper surface which is made in advance to upwardly project, a stress generating at an interface between the contact plug 3 and the first lower electrode film 4 is released, and resultingly, the first lower electrode film 4 does not peel off the contact plug 3, even if a tensile stress is turned into a compressive stress in a part of the first lower electrode film 4 in an annealing step carried out after the thin film capacitor has been completed.

In addition, in the thin film capacitor fabricated by the method in accordance with the fourteenth embodiment, since a part of the contact plug 3, that is, the extended portion radially extending from the upper surface, is allowed to lie on the interlayer insulating film 2, it would be possible to enhance designability of formation of the contact plug 3 in a horizontal direction in comparison with the thirteenth embodiment. As a result, fabrication cost of the thin film capacitor can be reduced.

[Fifteenth Embodiment]

FIGS. 18A to 18E are cross-sectional views of a thin film capacitor, illustrating respective steps of a method of fabricating the same, in accordance with the fifteenth embodiment.

The thin film capacitor in accordance with the first embodiment, illustrated in FIG. 3, is fabricated by the method in accordance with the fifteenth embodiment.

Figure 18A:
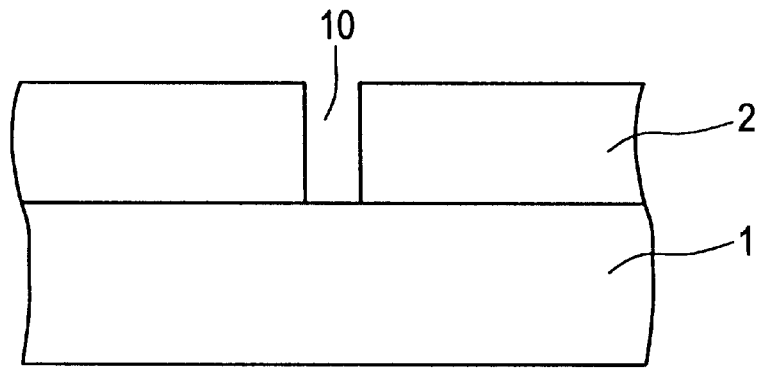
FIGS. 18A to 18E are cross-sectional views of a thin film capacitor illustrating respective steps of a method of fabricating the same, in accordance with the fifteenth embodiment of the present invention.

First, as illustrated in FIG. 18A, an interlayer insulating film 2 composed of $SiO_2$ is formed on a silicon substrate 1. Then, a contact hole 10 is formed throughout the interlayer insulating film 2.

Figure 18B:
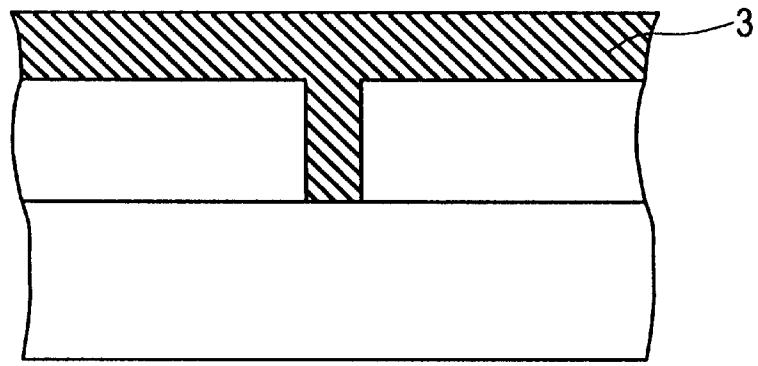

Then, as illustrated in FIG. 18B, contact material is deposited on the interlayer insulating film 2 such that the contact hole 10 is filled with the contact material.

Figure 18C:
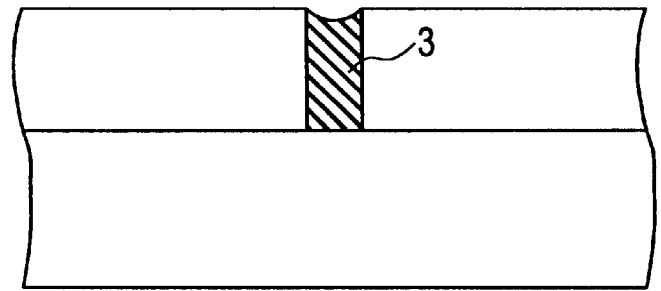

Then, as illustrated in FIG. 18C, the contact material is etched back by dry etching using conventional etching gases or chemical mechanical polishing (CMP) using abrasive material. The contact material is necessary to be etched back so sufficiently that the contact material 3 never exists on the interlayer insulating film 2.

As a result, the contact material is filled only in the contact hole 10 to thereby define a contact plug 3, and has an upper surface slightly recessed below a surface of the interlayer insulating film 2. Specifically, the contact plug 3 formed in the contact hole 10 has a recessed upper surface and has a smallest thickness at the center of the contact hole 10.

Figure 18D:
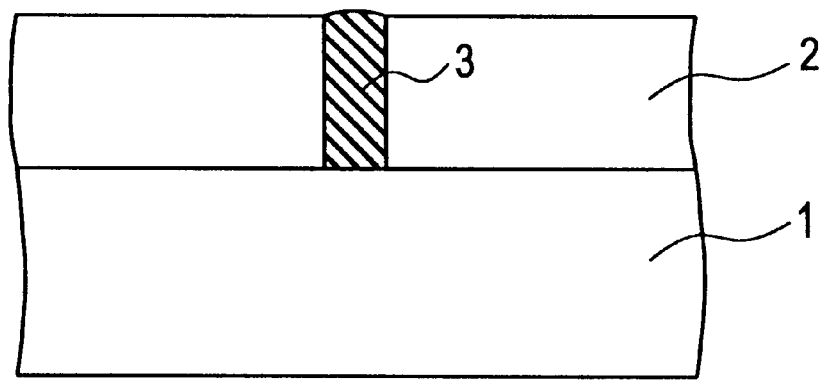

Then, silicon of which the contact plug 3 is composed is grown in the contact hole 10. As a result, the silicon grows and has an upper surface centrally upwardly projecting, as illustrated in FIG. 18D. Namely, a summit of the contact plug 3 is located higher than a surface of the interlayer insulating film 2.

Figure 18E:
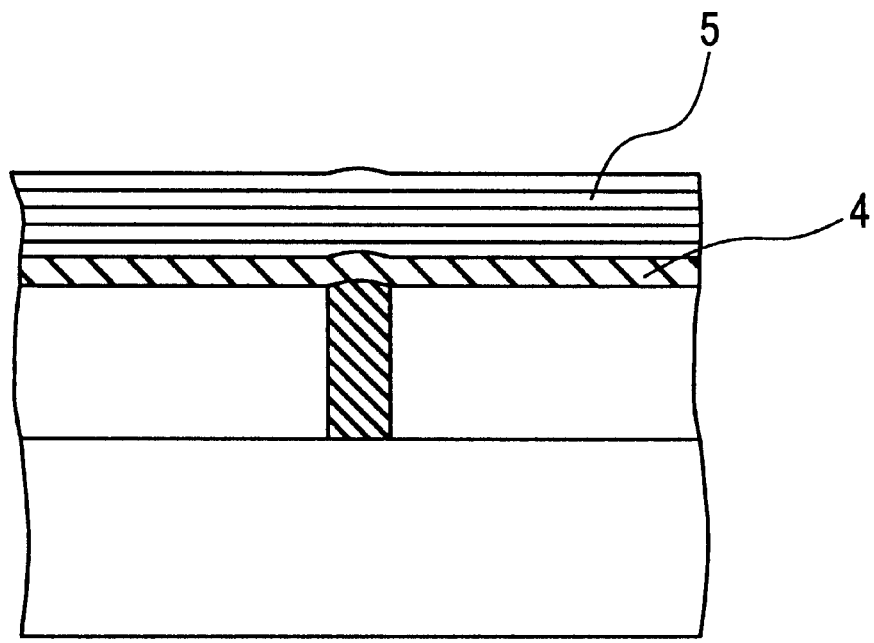

Then, as illustrated in FIG. 18E, a first lower electrode film 4 composed of TiN/TiSix is deposited on both the interlayer insulating film 2 and the contact plug 3, and thereafter, a second lower electrode film 5 composed of Ru is deposited on the first lower electrode film 4.

Then, the steps having been explained with respect to FIGS. 16D to 16F are carried out. Thus, there is completed the thin film capacitor in accordance with the first embodiment, illustrated in FIG. 3.

In the thin film capacitor fabricated through the method in accordance with the fifteenth embodiment, contact resistance between the contact plug 3 and the first lower electrode film 4 is not increased even after annealing steps to be carried after the thin film capacitor has been fabricated, in contrast to a thin film capacitor fabricated through a conventional method. Hence, it would be possible to properly operate the thin film capacitor.

[Sixteenth Embodiment]

FIGS. 19A to 19F are cross-sectional views of a thin film capacitor, illustrating respective steps of a method of fabricating the same, in accordance with the sixteenth embodiment.

The thin film capacitor in accordance with the second embodiment, illustrated in FIG. 5, is fabricated by the method in accordance with the sixteenth embodiment.

Figure 19A:
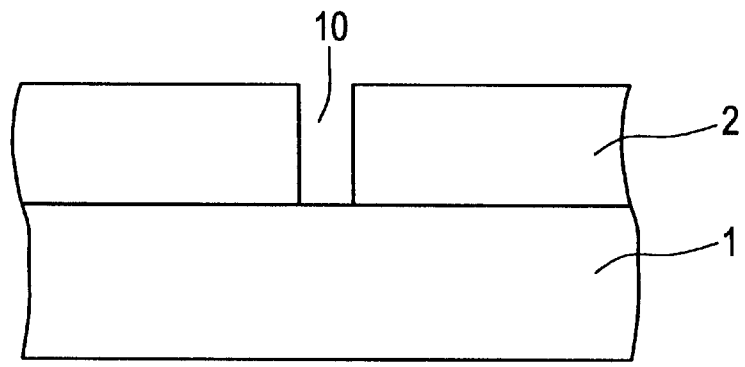
FIGS. 19A to 19F are cross-sectional views of a thin film capacitor illustrating respective steps of a method of fabricating the same, in accordance with the sixteenth embodiment of the present invention.

First, as illustrated in FIG. 19A, an interlayer insulating film 2 composed of $SiO_2$ is formed on a silicon substrate 1. Then, a contact hole 10 is formed throughout the interlayer insulating film 2.

Figure 19B:
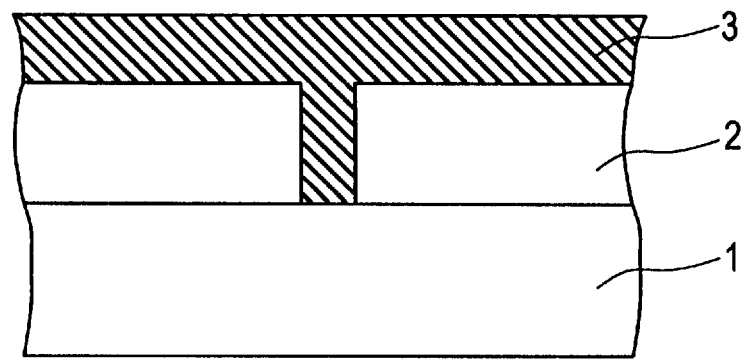

Then, as illustrated in FIG. 19B, contact material is deposited on the interlayer insulating film 2 such that the contact hole 10 is filled with the contact material.

Figure 19C:
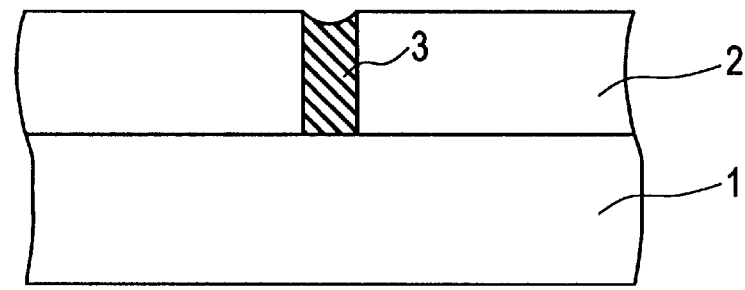

Then, as illustrated in FIG. 19C, the contact material is etched back by dry etching using conventional etching gases or chemical mechanical polishing (CMP) using abrasive material. The contact material is necessary to be etched back so sufficiently that the contact material 3 never exists on the interlayer insulating film 2.

As a result, the contact material is filled only in the contact hole 10 to thereby define a contact plug 3, and has an upper surface slightly recessed below a surface of the interlayer insulating film 2. Specifically, the contact plug 3 formed in the contact hole 10 has a recessed upper surface and has a smallest thickness at the center of the contact hole 10.

Figure 19D:
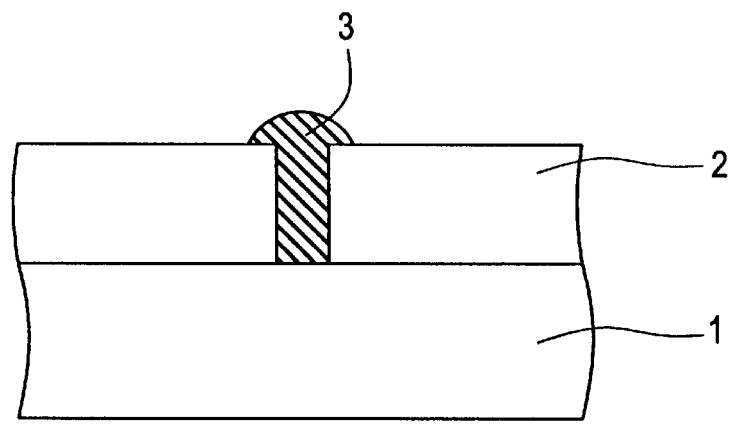

Then, silicon of which the contact plug 3 is composed is grown in the contact hole 10. When the silicon is grown in the contact hole 10, the silicon is designed to have a thickness greater than a depth of the contact hole 10. As a result, the silicon horizontally grows radially around the contact hole 10 on the interlayer insulating film 2. Thus, the contact plug 3 has an upper surface centrally upwardly projecting and an extended portion radially extending from the upper surface therearound on the interlayer insulating film 2, as illustrated in FIG. 19D.

Figure 19E:
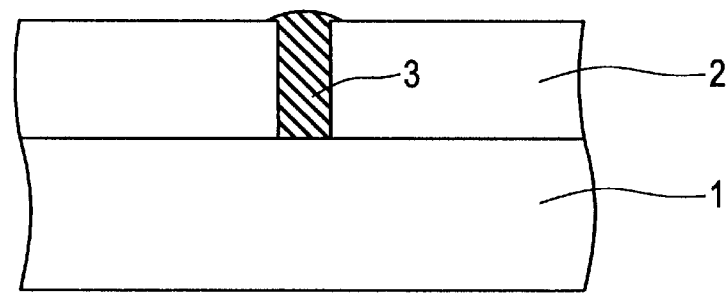

Then, as illustrated in FIG. 19E, the silicon is entirely etched back. As a result, the silicon remains above and around the contact hole 10 such that the upper surface of the silicon is kept to upwardly project.

Even if the silicon slightly remains on the interlayer insulating film 2, there is not caused any problems with respect to an operation of the thin film capacitor.

Figure 19F:
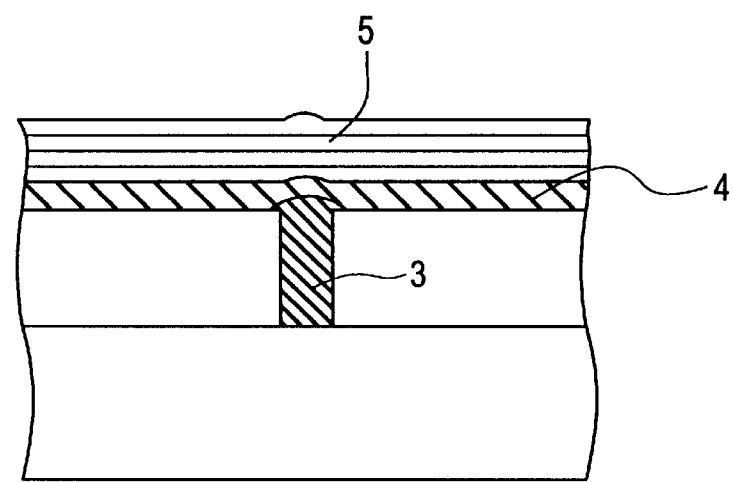

Then, as illustrated in FIG. 19F, a first lower electrode film 4 composed of TiN/TiSix is deposited on both the interlayer insulating film 2 and the contact plug 3, and thereafter, a second lower electrode film 5 composed of Ru is deposited on the first lower electrode film 4.

Then, the steps having been explained with respect to FIGS. 17E to 17G are carried out. Thus, there is completed the thin film capacitor in accordance with the second embodiment, illustrated in FIG. 5.

In the thin film capacitor fabricated through the method in accordance with the sixteenth embodiment, contact resistance between the contact plug 3 and the first lower electrode film 4 is not increased even after annealing steps to be carried after the thin film capacitor has been fabricated, in contrast to a thin film capacitor fabricated through a conventional method. Hence, it would be possible to properly operate the thin film capacitor.

In addition, in the thin film capacitor fabricated by the method in accordance with the sixteenth embodiment, since a part of the contact plug 3, that is, the extended portion radially extending from the upper surface, is allowed to lie on the interlayer insulating film 2, it would be possible to enhance designability of formation of the contact plug 3 in a horizontal direction in comparison with the fifteenth embodiment. As a result, fabrication cost of the thin film capacitor can be reduced.

[Seventeenth Embodiment]

FIGS. 20A to 20E are cross-sectional views of a thin film capacitor, illustrating respective steps of a method of fabricating the same, in accordance with the seventeenth embodiment.

The thin film capacitor in accordance with the ninth embodiment, illustrated in FIG. 12, is fabricated by the method in accordance with the seventeenth embodiment.

First, the steps having been explained with reference to FIGS. 16A to 16C are carried out to thereby form the contact plug 3 in the contact hole 10. The contact plug 3 has an upper surface upwardly projecting.

Then, a first lower electrode film 4 composed of TiN/TiSix is deposited on both the interlayer insulating film 2 and the contact plug 3, and thereafter, a second lower electrode film 5 composed of Pt is deposited on the first lower electrode film 4.

Figure 20A:
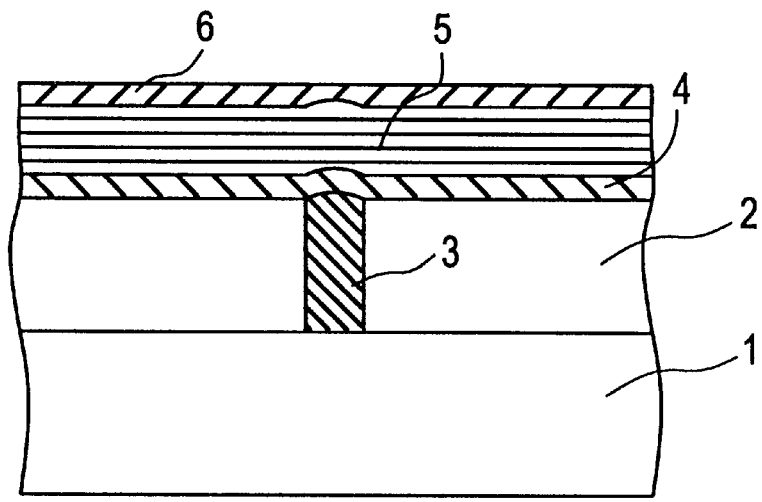
FIGS. 20A to 20E are cross-sectional views of a thin film capacitor illustrating respective steps of a method of fabricating the same, in accordance with the seventeenth embodiment of the present invention.

Then, as illustrated in FIG. 20A, a capacitor insulating film 6 composed of Pb (Zr, Ti) $O_3$ having a ferroelectric property is deposited on the second lower electrode film 5.

Figure 20B:
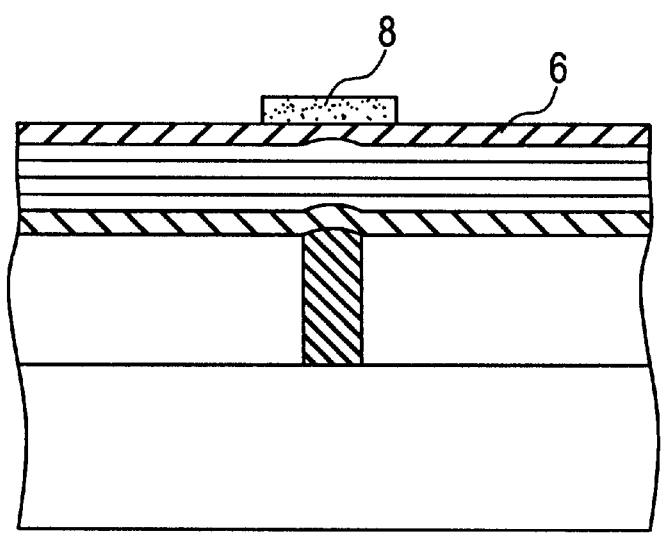

Then, as illustrated in FIG. 20B, a first upper electrode film 8 composed of Ir/$IrO_2$ is deposited over the capacitor insulating film 6, and then, is patterned into such a pattern that the patterned upper electrode film 8 is located above the contact plug 3.

Figure 20C:
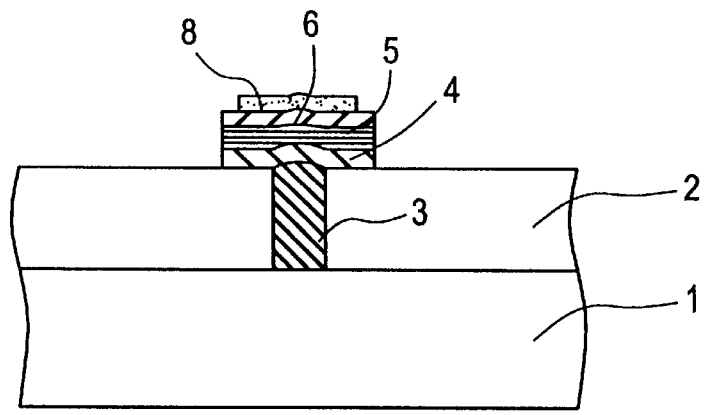

Then, as illustrated in FIG. 20C, the capacitor insulating film 6, the second lower electrode film 5 and the first lower electrode film 4 are patterned such that they are greater in an area than the first upper electrode film 8.

Figure 20D:
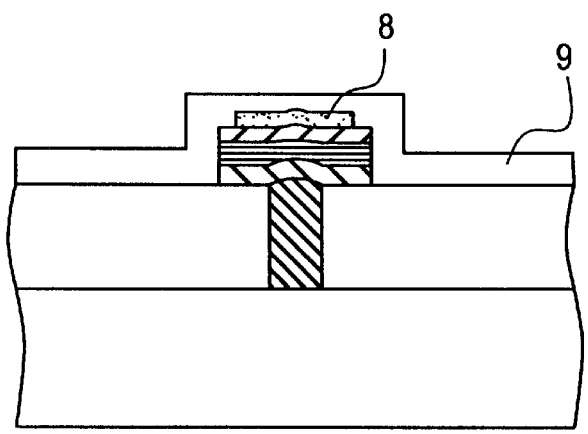

Then, as illustrated in FIG. 20D, a second interlayer insulating film 9 is deposited on the product illustrated in FIG. 20C.

Figure 20E:
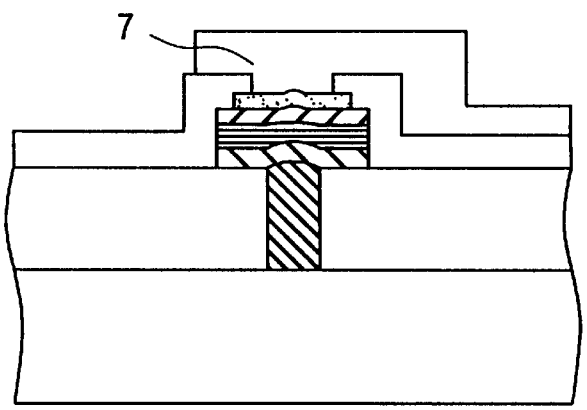

Then, as illustrated in FIG. 20E, the second interlayer insulating film 9 is formed with a contact hole through which the first upper electrode film 8 appears. Then, a second upper electrode film 7 composed of WSi is deposited on the second interlayer insulating film 9, and thereafter, is patterned into a desired pattern.

Thus, there is completed the thin film capacitor in accordance with the ninth embodiment, illustrated in FIG. 12.

The method in accordance with the present embodiment is particularly effective when there is used the capacitor insulating film 6 having poor coverage.

In the thin film capacitor fabricated through the method in accordance with the seventeenth embodiment, contact resistance between the contact plug 3 and the first lower electrode film 4 is not increased even after annealing steps to be carried after the thin film capacitor has been fabricated, in contrast to a thin film capacitor fabricated through a conventional method. Hence, it would be possible to properly operate the thin film capacitor.

In the above-mentioned embodiments, the contact plug 3 is composed of silicon into which phosphorus is doped. However, the contact plug 3 may be composed of other materials. For instance, the contact plug 3 may be composed of polysilicon or tungsten. As an alternative, the contact plug 3 may be comprised of a tungsten layer and a layer composed of TiN/Ti formed below the tungsten layer.

In the above-mentioned embodiments, the dielectric film having a high dielectric constant is composed of (Ba, Sr) $TiO_3$, and the ferroelectric film is composed of Pb (Zr, Ti) $O_3$. In the specification, the dielectric film having a high dielectric constant means a film having a higher dielectric constant than a dielectric constant of $SiO_2$ or $Si_3N_4$. Any film may be used, unless the film has such a dielectric constant.

The capacitor insulating film 6 may be composed at least partially of chemical compound defined as $ABO_3$. The constituent "A" may be selected from Ba, Sr, Pb, Ca, La, Li and K alone or in combination. The constituent "B" may be selected from Zr, Ti, Ta, Nb, Mg, Mn, Fe, Zn and W alone or in combination. For instance, the chemical compound defined as $ABO_3$ includes $SrTiO_3$, $PbTiO_3$, (Pb, La) (Zr, Ti) $O_3$, Pb (Mg, Nb) $O_3$, Pb (Mg, W) $O_3$, Pb (Zn, Nb) $O_3$, $LiTaO_3$, $LiNbO_3$, $KTaO_3$ and $KNbO_3$.

As an alternative, the capacitor insulating film 6 may be composed at least partially of chemical compound defined as $(Bi_2O_2)$ $(A_{m-1}B_mO_{3+1})$ wherein "m" is an integer equal to 1, 2, 3, 4 or 5. The constituent "A" may be selected from Ba, Sr, Pb, Ca, K and Bi alone or in combination. The constituent "B" may be selected from Nb, Ta, Ti and W alone or in combination. For instance, the chemical compound defined as $(Bi_2O_2)$ $(A_{m-1}B_mO_{3m+1})$ includes $Bi_4Ti_3O_{12}$, $SrBi_2Ta_2O_9$ and $SrBi_2Nb_2O_9$.

As an alternative, the capacitor insulating film 6 may be composed at least partially of $Ta_2O_5$.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 11-159416 filed on Jun. 7, 1999 including specification, claims, drawings and summary is incorporated herein by reference in its entirety.

What is claimed is:

1. A thin film capacitor comprising:
    (a) a semiconductor substrate;
    (b) an interlayer insulating film formed on said semiconductor substrate;
    (c) a contact formed throughout said interlayer insulating film such that said contact has an upper surface upwardly projecting;
    (d) a lower electrode formed on said interlayer insulating film such that said lower electrode covers said upper surface of said contact therewith;
    (e) a capacitor insulating film covering said lower electrode and said interlayer insulating film therewith; and
    (f) an upper electrode formed on said capacitor insulating film.

2. The thin film capacitor as set forth in claim 1, wherein said capacitor insulating film is composed at least partially of any one of $ABO_3$, $(Bi_2O_2)$ $(A_{m-1}B_mO_{3m+1})$ and $Ta_2O_5$,
    wherein m is an integer ranging from 1 to 5 both inclusive,
    A in said $ABO_3$ includes at least one of Ba, Sr, Pb, Ca, La, Li and K,
    B in said $ABO_3$ includes at least one of Zr, Ti, Ta, Nb, Mg, Mn, Fe, Zn and W,
    A in said $(Bi_2O_2)$ $(A_{m-1}B_mO_{3m+1})$ includes at least one of Ba, Sr, Pb, Ca, K and Bi, and
    B in said $(Bi_2O_2)$ $(A_{m-1}B_mO_{3m+1})$ includes at least one of Nb, Ta, Ti and W.

3. The thin film capacitor as set forth in claim 1, wherein said lower electrode is comprised of a first lower electrode film, and a second lower electrode film formed on said first lower electrode film.

4. The thin film capacitor as set forth in claim 3, wherein said upper electrode and said second lower electrode film are composed of the same material.

5. A thin film capacitor comprising:
    (a) a semiconductor substrate;
    (b) a first interlayer insulating film formed on said semiconductor substrate;
    (c) a contact formed throughout said first interlayer insulating film such that said contact has an upper surface upwardly projecting;
    (d) a lower electrode formed on said first interlayer insulating film such that said lower electrode covers said upper surface of said contact therewith;
    (e) a capacitor insulating film formed on said lower electrode;
    (f) a first upper electrode formed on said capacitor insulating film;

(g) a second interlayer insulating film covering said first interlayer insulating film, said lower electrode, said capacitor insulating film and said first upper electrode therewith, said second interlayer insulating film being formed with an opening above said first upper electrode; and (h) a second upper electrode formed on said second interlayer insulating film such that said second upper electrode makes electrical contact with said first upper electrode through said opening of said second interlayer insulating film.

6. The thin film as set forth in claim 5, wherein said first upper electrode is equal in an area to said capacitor insulating film.

7. The thin film as set forth in claim 5, wherein said first upper electrode is smaller in an area than said capacitor insulating film.

8. The thin film capacitor as set forth in claim 5, wherein said capacitor insulating film is composed at least partially of any one of $ABO_3$, $(Bi_2O_2)$ $(A_{m-1}B_mO_{3m+1})$ and $Ta_2O_5$, wherein m is an integer ranging from 1 to 5 both inclusive, A in said $ABO_3$ includes at least one of Ba, Sr, Pb, Ca, La, Li and K, B in said $ABO_3$ includes at least one of Zr, Ti, Ta, Nb, Mg, Mn, Fe, Zn and W, A in said $(Bi_2O_2)$ $(A_{m-1}B_mO_{3m+1})$ includes at least one of Ba, Sr, Pb, Ca, K and Bi, and B in said $(Bi_2O_2)$ $(A_{m-1}B_mO_{3m+1})$ includes at least one of Nb, Ta, Ti and W.

9. The thin film capacitor as set forth in claim 5, wherein said lower electrode is comprised of a first lower electrode film, and a second lower electrode film formed on said first lower electrode film.

10. The thin film capacitor as set forth in claim 9, wherein said second upper electrode and said second lower electrode film are composed of the same material.

11. A thin film capacitor comprising:

(a) a semiconductor substrate;

(b) an interlayer insulating film formed on said semiconductor substrate;

(c) a contact formed throughout said interlayer insulating film such that said contact has an upper surface upwardly projecting and an extended portion radially extending from said upper surface around said contact on said interlayer insulating film;

(d) a lower electrode formed on said interlayer insulating film such that said lower electrode covers said upper surface and said extended portion of said contact therewith;

(e) a capacitor insulating film covering said lower electrode and said interlayer insulating film therewith; and (f) an upper electrode formed on said capacitor insulating film.

12. The thin film capacitor as set forth in claim 11, wherein said capacitor insulating film is composed at least partially of any one of $ABO_3$, $(Bi_2O_2)$ $(A_{m-1}B_mO_{3m+1})$ and $Ta_2O_5$, wherein m is an integer ranging from 1 to 5 both inclusive, A in said $ABO_3$ includes at least one of Ba, Sr, Pb, Ca, La, Li and K, B in said $ABO_3$ includes at least one of Zr, Ti, Ta, Nb, Mg, Mn, Fe, Zn and W, A in said $(Bi_2O_2)$ $(A_{m-1}B_mO_{3m+1})$ includes at least one of Ba, Sr, Pb, Ca, K and Bi, and B in said $(Bi_2O_2)$ $(A_{m-1}B_mO_{3m+1})$ includes at least one of Nb, Ta, Ti and W.

13. The thin film capacitor as set forth in claim 11, wherein said lower electrode is comprised of a first lower electrode film, and a second lower electrode film formed on said first lower electrode film.

14. The thin film capacitor as set forth in claim 13, wherein said upper electrode and said second lower electrode film are composed of the same material.

15. A thin film capacitor comprising:

(a) a semiconductor substrate;

(b) a first interlayer insulating film formed on said semiconductor substrate;

(c) a contact formed throughout said first interlayer insulating film such that said contact has an upper surface upwardly projecting and an extended portion radially extending from said upper surface around said contact on said first interlayer insulating film;

(d) a lower electrode formed on said first interlayer insulating film such that said lower electrode covers of said upper surface and said extended portion of said contact therewith;

(e) a capacitor insulating film formed on said lower electrode;

(f) a first upper electrode formed on said capacitor insulating film;

(g) a second interlayer insulating film covering said first interlayer insulating film, said lower electrode, said capacitor insulating film and said first upper electrode therewith, said second interlayer insulating film being formed with an opening above said first upper electrode; and (h) a second upper electrode formed on said second interlayer insulating film such that said second upper electrode makes electrical contact with said first upper electrode through said opening of said second interlayer insulating film.

16. The thin film as set forth in claim 15, wherein said first upper electrode is equal in an area to said capacitor insulating film.

17. The thin film as set forth in claim 15, wherein said first upper electrode is smaller in an area than said capacitor insulating film.

18. The thin film capacitor as set forth in claim 15, wherein said capacitor insulating film is composed at least partially of any one of $ABO_3$, $(Bi_2O_2)$ $(A_{m-1}B_mO_{3m+1})$ and $Ta_2O_5$, wherein m is an integer ranging from 1 to 5 both inclusive, A in said $ABO_3$ includes at least one of Ba, Sr, Pb, Ca, La, Li and K, B in said $ABO_3$ includes at least one of Zr, Ti, Ta, Nb, Mg, Mn, Fe, Zn and W, A in said $(Bi_2O_2)$ $(A_{m-1}B_mO_{3m+1})$ includes at least one of Ba, Sr, Pb, Ca, K and Bi, and B in said $(Bi_2O_2)$ $(A_{m-1}B_mO_{3m+1})$ includes at least one of Nb, Ta, Ti and W.

19. The thin film capacitor as set forth in claim 15, wherein said lower electrode is comprised of a first lower electrode film, and a second lower electrode film formed on said first lower electrode film.

20. The thin film capacitor as set forth in claim 19, wherein said second upper electrode and said second lower electrode film are composed of the same material.

* * * * *